(12) United States Patent
Strandvik et al.

(10) Patent No.: US 11,955,983 B2
(45) Date of Patent: Apr. 9, 2024

(54) ERROR-FEEDBACK SAR-ADC

(71) Applicant: Nordic Semiconductor ASA, Trondheim (NO)

(72) Inventors: Erlend Strandvik, Trondheim (NO); Harald Garvik, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 162 days.

(21) Appl. No.: 17/842,255

(22) Filed: Jun. 16, 2022

(65) Prior Publication Data
US 2022/0407530 A1 Dec. 22, 2022

(51) Int. Cl.
*H03M 1/06* (2006.01)
*H03M 1/00* (2006.01)

(52) U.S. Cl.
CPC .......... *H03M 1/0626* (2013.01); *H03M 1/002* (2013.01)

(58) Field of Classification Search
CPC .......... H03M 1/00; H03M 1/06; H03M 1/002; H03M 1/426; H03M 1/466; H03M 1/0845; H03M 1/1061; H03M 1/458; H03M 1/0626
See application file for complete search history.

(56) References Cited

U.S. PATENT DOCUMENTS 8,599,059 B1 * 12/2013 Chung ................... H03M 1/466
341/172
8,736,480 B1 * 5/2014 Cowley ................ H03M 1/0626
341/172
9,154,152 B1 * 10/2015 Chiu ..................... H03M 1/468

(Continued)

FOREIGN PATENT DOCUMENTS

EP 3 829 058 A1 6/2021

OTHER PUBLICATIONS

Hojati Zeinab et al: "An NTF-enhanced incremental [Sigma][Delta] modulator using a SAR quantizer", Integration, The VLSI Journal, North-Holland Publishing Company. Amsterdam, NL, vol. 55, Jun. 16, 2016 (Jun. 16, 2016), pp. 212-219.

(Continued)

*Primary Examiner* — Lam T Mai
(74) *Attorney, Agent, or Firm* — Klarquist Sparkman, LLP

(57) ABSTRACT

Analog to digital conversion circuitry has an input sampling buffer, which has an input sampling capacitor for sampling an analog signal. The conversion circuitry also has a successive-approximation-register analog to digital converter (SAR-ADC) which converts the sampled analog signal to a digital signal. The input sampling buffer has an amplifier and a gain-control capacitor, and has an amplification configuration and an error-feedback configuration. In the amplification configuration, the input sampling capacitor is coupled to the amplifier and gain-control capacitor, with the gain-control capacitor connected in feedback with the amplifier, for applying gain to the sampled analog signal. In the error-feedback configuration, the gain-control capacitor is decoupled from the input sampling capacitor and receives a residue voltage from the SAR-ADC, such that the level of the analog signal determined in the amplification configuration varies depending on the residue voltage received onto the gain-control capacitor in the error-feedback configuration.

20 Claims, 17 Drawing Sheets

(56) References Cited

U.S. PATENT DOCUMENTS

| | | | | |
|---|---|---|---|---|
| 9,467,161 | B1* | 10/2016 | Kim | H03M 1/145 |
| 9,843,340 | B2* | 12/2017 | Funato | H03M 1/466 |
| 10,432,213 | B1* | 10/2019 | Aboudina | H03M 1/468 |
| 10,461,767 | B1* | 10/2019 | Farid | H03M 1/462 |
| 10,541,698 | B1* | 1/2020 | Moore | H03M 1/1245 |
| 10,790,842 | B1* | 9/2020 | Paussa | H03M 1/069 |
| 10,886,933 | B1* | 1/2021 | Ghosh | H03M 1/164 |
| 11,171,662 | B1* | 11/2021 | Steensgaard-Madsen | H03M 1/466 |
| 11,646,747 | B1* | 5/2023 | Lok | H03M 1/0609 341/120 |
| 2006/0187106 | A1* | 8/2006 | Mitra | H03M 1/007 341/155 |
| 2010/0207791 | A1* | 8/2010 | Ohnhaeuser | H03M 1/0612 341/135 |
| 2011/0260899 | A1* | 10/2011 | Snedeker | H03M 1/1047 341/118 |
| 2012/0105265 | A1* | 5/2012 | Agarwal | H03M 1/002 341/172 |
| 2013/0027232 | A1* | 1/2013 | Liu | H03M 1/145 341/110 |
| 2013/0044015 | A1* | 2/2013 | Reinhold | H03M 1/1061 341/110 |
| 2014/0253351 | A1* | 9/2014 | Kumar | H03M 1/1061 341/118 |
| 2017/0012633 | A1* | 1/2017 | Venca | H03M 1/466 |
| 2017/0012636 | A1* | 1/2017 | Venca | H03M 1/38 |
| 2017/0012637 | A1* | 1/2017 | Venca | H03M 1/68 |
| 2017/0026053 | A1* | 1/2017 | Lee | H03M 1/1245 |
| 2017/0250702 | A1* | 8/2017 | Venca | H03M 1/667 |
| 2017/0317683 | A1* | 11/2017 | Bandyopadhyay | H03M 3/426 |
| 2019/0097648 | A1* | 3/2019 | Sim | H03M 3/464 |
| 2019/0348993 | A1* | 11/2019 | Kulkarni | H03M 1/38 |
| 2022/0069834 | A1* | 3/2022 | Sahu | H03M 1/0626 |
| 2022/0077867 | A1* | 3/2022 | An | H03M 1/1061 |
| 2023/0387929 | A1* | 11/2023 | Sedighi | H03M 1/0854 |

OTHER PUBLICATIONS

Shaolan Li et al: "Noise-Shaping SAR ADCs : Advances in Analog Circuit Design 2019" In: "Next-Generation ADCs, High-Performance Power Management, and Technology Considerations for Advanced Integrated Circuits : Advances in Analog Circuit Design 2019", Oct. 25, 2019 (Oct. 25, 2019), Springer International Publishing, pp. 21-40.

Garvik et al., "A 68 SNDR Compiled Noise-Shaping SAR ADC With On-Chip CDAC Calibration," *IEEE Asian Solid-State Circuits Conference*, Nov. 2019, 2 pages.

IPO Combined Search and Examination Report under Sections 17 and 18(3) for Application No. GB2108885.1, dated Nov. 16, 2021, 5 pages.

Lee et al., "Accuracy Considerations in Self-Calibrating A/D Converters," *IEEE Transactions on Circuits and Systems*, vol. CAS-32, No. 6, Jun. 1985, pp. 590-597.

Lee et al., "A Self-Calibrating 15 Bit CMOS A/D Converter," *IEEE Journal of Solid Solid-State Circuits*, vol. SC-19, No. 6, Dec. 1984, pp. 813-819.

Li et al., "A 13-ENOB Second-Order Noise-Shaping SAR ADC Realizing Optimized NTF Zeros Using the Error-Feedback Structure," *IEEE Journal of Solid-State Circuits*, vol. 53, No. 12, Dec. 2018, pp. 3484-3496.

Zhu et al., "A 10-bit 100-MS/s Reference-Free SAR ADC in 90 nm CMOS," *IEEE Journal of Solid-State Circuits*, vol. 45, No. 6, Jun. 2010, pp. 1111-1121.

* cited by examiner

ERROR-FEEDBACK SAR-ADC

CROSS-REFERENCE TO RELATED APPLICATION

This application claims priority from Great Britain Application No. 2108885.1, filed Jun. 21, 2021, which application is incorporated herein by reference in its entirety.

BACKGROUND

This invention relates to analog to digital conversion circuitry.

Noise-shaping successive-approximation-register analog to digital converters (SAR-ADCs) achieve high accuracy with good power efficiency by introducing concepts from sigma-delta (AZ) ADCs into SAR-ADCs. They do this by taking the residue voltage, left on the top plates of the capacitor digital-to-analog converter (CDAC) after each bit-cycling conversion, and feeding the residue into a filter which then subtracts it from the next analog sample. One structure that can be used to implement such noise-shaping is an error-feedback structure, in which the residue voltage is fed back to the input of the SAR-ADC and is subtracted from the next sample at the input.

The residue voltage represents a combination of the different noise sources present in the ADC, such as quantization noise and comparator noise. By performing this residue subtraction operation over a series of consecutive samples, low-frequency noise can be suppressed, at the cost of increased high-frequency noise. By oversampling the input, a decimation filter can then be applied at the output of the SAR-ADC to remove the high-frequency noise, resulting in an improvement in accuracy over a similar SAR-ADC without noise-shaping.

Adding such error-feedback can, however, add to the size and power consumption of the ADC, which is undesirable.

Embodiments of the present invention seek to provide a more efficient design of error-feedback SAR-ADC conversion circuitry.

SUMMARY

From a first aspect, the invention provides analog to digital conversion circuitry, comprising:
an input sampling buffer, comprising an input sampling capacitor, for sampling an analog signal; and
a successive-approximation-register analog to digital converter (SAR-ADC) arranged to convert the analog signal, sampled by input sampling buffer, to a digital signal,
wherein the input sampling buffer further comprises an amplifier and a gain-control capacitor; and
wherein the input sampling buffer has an amplification configuration and an error-feedback configuration, wherein, when the input sampling buffer is in the amplification configuration, the input sampling capacitor is coupled to the amplifier and gain-control capacitor, with the gain-control capacitor connected in feedback with the amplifier, for applying gain to the analog signal sampled by the input sampling capacitor, and, when the input sampling buffer is in the error-feedback configuration, the gain-control capacitor is decoupled from the input sampling capacitor and is arranged to receive a residue voltage from the SAR-ADC, such that the level of the analog signal determined in the amplification configuration varies, at least in part, in dependence on the residue voltage received onto the gain-control capacitor in the error-feedback configuration.

From a second aspect, the invention provides an analog to digital conversion method, comprising:
sampling an analog signal with an input sampling capacitor;
using an amplifier and a gain-control capacitor, connected in feedback with the amplifier, to apply gain to the analog signal sampled by the input sampling capacitor;
converting the analog signal to a digital signal using successive-approximation-register analog to digital converter (SAR-ADC); and
decoupling the gain-control capacitor from the input sampling capacitor and feeding a residue voltage from the SAR-ADC back to the gain-control capacitor, such that the level of the analog signal, after gain is applied, is determined, at least in part, by a residue voltage previously received onto the gain-control capacitor.

Thus it will be seen that, in accordance with embodiments of the invention, the same gain-control capacitor is used both as a feedback capacitor for the amplifier (to determine the gain applied to the sampled analog signal) and also for receiving a residue voltage from the SAR-ADC. The residue voltage can thus be conveniently used to affect the level of the subsequent sample—e.g. by being subtracted from the input signal—without having to provide a dedicated separate residue buffer, comprising one or more additional capacitors, in addition to the capacitors in the input sampling buffer, and without requiring a second amplifier for transferring the residue voltage. Embodiments can therefore be particularly efficient both in area and power consumption.

Moreover, using the same gain-control capacitor both for passing samples into the SAR-ADC and for receiving a residue voltage back from the SAR-ADC, avoids any need to transfer the voltage residue between buffers, ensuring no attenuation losses and avoiding a requirement for dynamic amplification, which might otherwise require complex calibration to mitigate process, temperature and voltage variations.

The analog to digital conversion circuitry is preferably arranged to provide error-feedback noise-shaping. It may be configured to oversample the input signal. It may comprise a decimation filter for down-sampling the digital signal generated by the SAR-ADC. The use of noise-shaping in preferred embodiments can advantageously provide increased accuracy, albeit with lower effective bandwidth, without having to increase the area, and therefore the power consumption, e.g. when the ADC is implemented as an integrated circuit.

The gain, determined by the gain-control capacitor, may be positive or it may be negative (i.e. to attenuate the analog signal, if the supply input range is too large for the SAR-ADC). The gain-control capacitor may be of fixed or variable capacitance. The gain may be configurable.

The analog to digital conversion circuitry may comprise a control interface for receiving control signals, e.g. from a processor or microcontroller.

The successive-approximation-register analog to digital converter may be a differential converter. It may comprise respective positive and negative paths. The amplifier may be a differential amplifier. The input sampling buffer may comprise a pair of input sampling capacitors, which may be of the same nominal capacitance. It may comprise a pair of gain-control capacitors, which may be of the same nominal capacitance. These capacitor pairs may be provided on respective positive and negative paths of the differential converter.

The amplifier may be an operational transconductance amplifier (OTA).

The input sampling buffer preferably comprises a set of one or more switches for switching between the amplification configuration (i.e. state, or mode of operation) and the error-feedback configuration (i.e. state, or mode of operation). It may comprise a plurality switches for selection of the amplification and error-feedback configurations. A first subset of the switches may be closed when operating in the amplification configuration and open when not in the amplification configuration. A second subset of the switches may be closed when operating in the error-feedback configuration and open when not in the error-feedback configuration. The input sampling buffer may thus be switched between the configurations (and any optional further configurations) by selectively opening and closing switches.

The ADC circuitry may comprise control logic for controlling the switches. The control logic may comprise a hardware finite state machine. The control logic may be implemented in hardware (e.g. using dedicated sequential logic), or it may be implemented in software, or by a combination of hardware and software. When using software, the ADC circuitry may comprise a processor and a memory storing software for execution by the processor.

The input sampling buffer may be configured to receive the analog signal onto the input sampling capacitor when in the error-feedback configuration. However, in other embodiments, the input sampling buffer may have a sampling configuration, in which it is configured to receive the analog signal onto the input sampling capacitor, which may be distinct from the error-feedback configuration and/or from the amplification configuration.

The ADC circuitry may control the input sampling buffer to cycle between the error-feedback configuration and the amplification configuration (optionally also passing through one or more further configurations) at a sampling rate. It may cycle once for each sample of a succession of samples provided to the SAR-ADC from the input sampling buffer.

The residue voltage from one sample may influence the level of a subsequent—e.g. the next—sample provided to the SAR-ADC. The input sampling buffer may be arranged to subtract the residue voltage from the next sample—i.e. to provide the SAR-ADC with the difference between the residue voltage and the sample with nominal gain applied.

The gain-control capacitor may be arranged to be connected in parallel with the amplifier when the input sampling buffer is in the amplification configuration.

The input sampling buffer may comprise one or more dedicated-error-feedback capacitors, each arranged to be switchably connected in feedback with the amplifier (i.e. arranged to be switchably connected in parallel with the amplifier). Each dedicated-error-feedback capacitor may be switchable independently from the gain-control capacitor. This may, in some embodiments, allow the gain-control capacitor and one or more dedicated-error-feedback capacitors to be connected in feedback with the amplifier, when in the error-feedback configuration. This can allow the gain to be adjusted for different situations. The gain-control capacitor and the one or more dedicated-error-feedback capacitors may be connected in parallel with each other when in the error-feedback configuration. Switches may allow the dedicated-error-feedback capacitors to be decoupled (i.e. not used) when in the amplification configuration. In this way, the feedback capacitance applied to the amplifier can be different in the two configurations. This may be useful e.g. for setting coefficients in the filter transfer function, when using a higher-order filter, through selectively attenuating the error-feedback voltage.

The SAR-ADC preferably comprises a capacitor digital-to-analog converter (CDAC), which may be a differential CDAC. The ADC circuitry preferably comprises control logic for performing bit-cycling with CDAC. The residue voltage may be received from the top plates of the capacitors of the CDAC. A positive residue voltage component may be received from a positive side of the CDAC by a positive-side gain-control capacitor, in the error-feedback configuration, and a negative residue voltage component may be received from a negative side of the CDAC by a negative-side gain-control capacitor.

The ADC circuitry may, in some embodiments, comprise calibration circuitry for performing a calibration of the SAR-ADC. It may be configured to calibrate each of a set of a capacitors of a CDAC of the SAR-ADC. It may calibrate a strict subset of the capacitors, which may be a succession of the most significant capacitors of the CDAC—i.e. a subset of capacitors of CDAC each having larger capacitance than any of the capacitors of the CDAC that are not in the subset. The calibration circuitry may be arranged to calibrate one capacitor or one differential capacitor pair at a time. It may calibrate the capacitors in order from largest to smallest.

Such calibration may improve the linearity of the SAR-ADC. In some embodiments, it may be advantageously implemented by digital control, without requiring any additional analog circuitry. The calibration circuitry may be arranged, when calibrating a capacitor (or capacitor pair), to switch capacitors of the CDAC so as to generate a residual voltage that is proportional to a mismatch between the capacitor being calibrated and one or more further capacitors of the CDAC. It may determine a mismatch between the capacitor under calibration and a set of other capacitors of total nominal capacitance equal to the capacitor under calibration.

The ADC circuitry may support a calibration configuration (i.e. a calibration state or mode), in which the gain-control capacitor is decoupled from the input sampling capacitor and is arranged to receive a mismatch voltage from the SAR-ADC. In this way, an error-feedback noise-shaping loop may be used to sample a residual mismatch voltage, which resides on the top plates of the CDAC after the switching. This efficient use of the input sampling buffer also for calibration can avoid the need for additional analog components and capacitors to provide calibration. Sampling the mismatch residue onto the gain-control (error-feedback) capacitor can also advantageously allow the SAR-ADC to be reset without the mismatch residue being deleted by the reset. The calibration circuitry may be arranged to convert the mismatch voltage with the SAR-ADC. It preferably does so using a succession of the least significant capacitors of a CDAC—i.e. using a mismatch-sampling subset of capacitors of the CDAC, each having capacitance no larger than any of the capacitors of the CDAC that are not in the mismatch-sampling subset.

Use of this mismatch-sampling subset of the SAR-ADC, together with oversampling, can give a highly accurate measurement of the error residual voltage due to mismatch, in a compact implementation. For each capacitor being calibrated, a plurality of samples may be taken and averaged to suppress noise and increase accuracy. The ADC circuitry may be configured to calculate calibration coefficients from digital measurements, output by the SAR-ADC, of the mismatches of a set of capacitors of the SAR-ADC. These coefficients may be used to increase linearity of the ADC in subsequent operation. The ADC circuitry may be configured to adjust the digital signal output by the SAR-ADC in dependence on one or more of the calibration coefficients—e.g. being configured to add or subtract one or more calibration coefficients from subsequent digital samples.

In any of the embodiments disclosed herein, the ADC conversion circuitry may be provided by an integrated-circuit device, such as a system-on-chip. It may be integrated as a peripheral to a processor, such as microcontroller. It have an input for receiving the analog signal and/or an output for outputting the digital signal.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1:
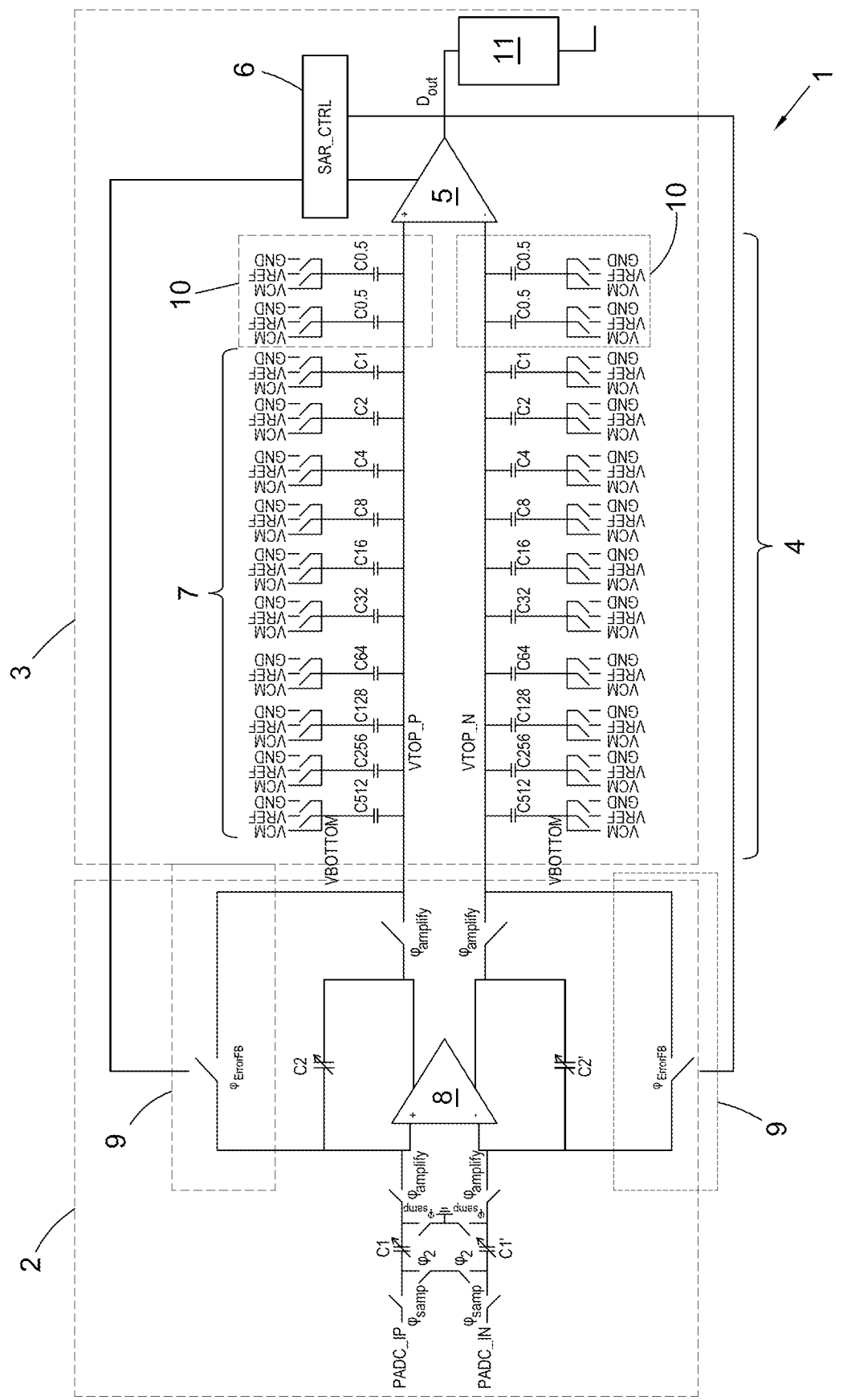
FIG. 1 is a schematic architectural diagram of an ADC, embodying the invention, having a programmable-gain switched-capacitor input sampling buffer and an SAR-ADC for converting the samples from the sampling buffer.

FIG. 1 shows the high-level architecture of an analog-to-digital converter (ADC) 1 circuit portion. It may, in some embodiments, be incorporated as a peripheral within an integrated-circuit system-on-chip (SoC), such as a digital radio on a chip, or it may be used in any other appropriate context. The initials "PADC" are used in the drawings as an abbreviation for "peripheral ADC", in contemplation of the ADC 1 being a peripheral of a microcontroller unit, but this is only by way of example.

The ADC 1 has a programmable-gain switched-capacitor input sampling buffer 2, which is coupled to an SAR-ADC 3 for converting the samples sampled by the buffer 2.

Through the innovative use of feedback, as explained below, this ADC 1 enables first-order error-feedback noise-shaping, where the input sampling buffer 2 is reused as a loop filter. This configuration gives a signal transfer function STF=1, and a noise transfer function NTF=1−$z^{-1}$.

The SAR-ADC 3 comprises a differential capacitor digital-to-analog converter (CDAC) array 4 which feeds into a comparator 5. It also has a control block control logic, SAR_CTRL 6, and output circuitry 11.

Figure 2:
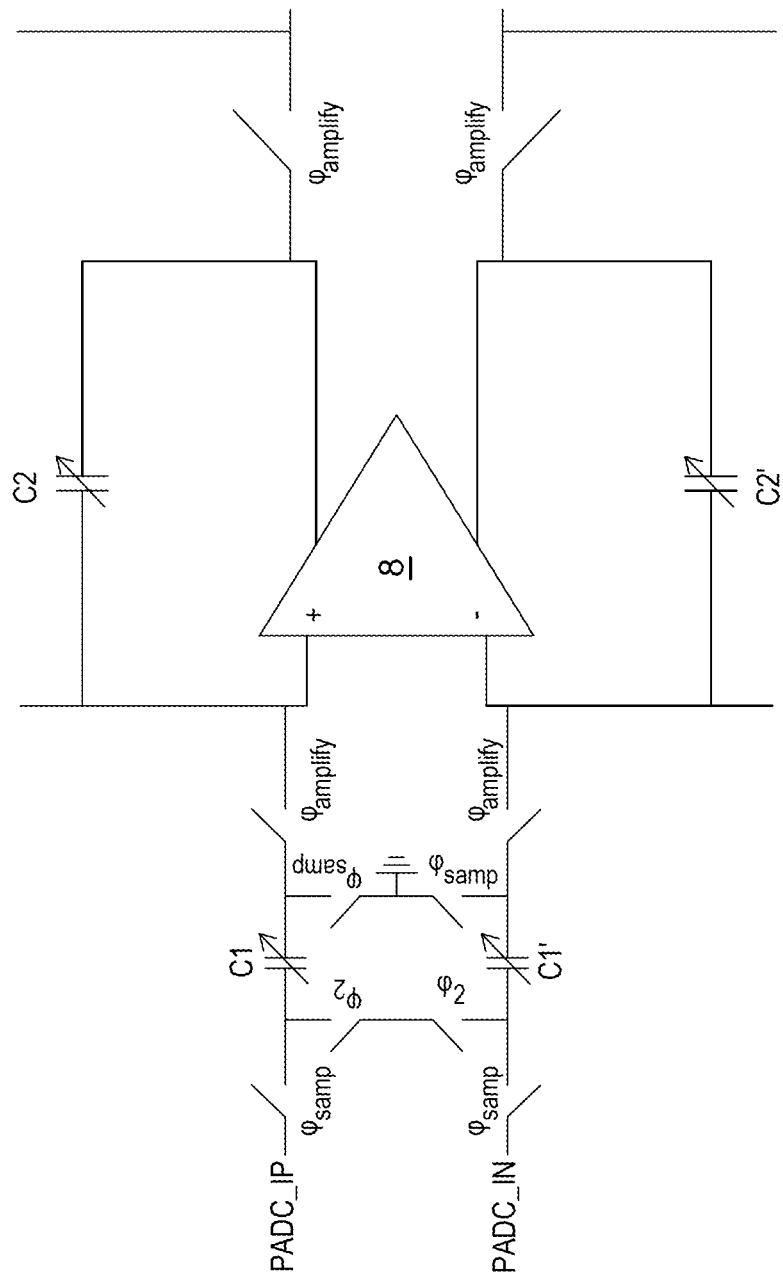
FIG. 2 is a close-up view of part of FIG. 1.
Figure 5:
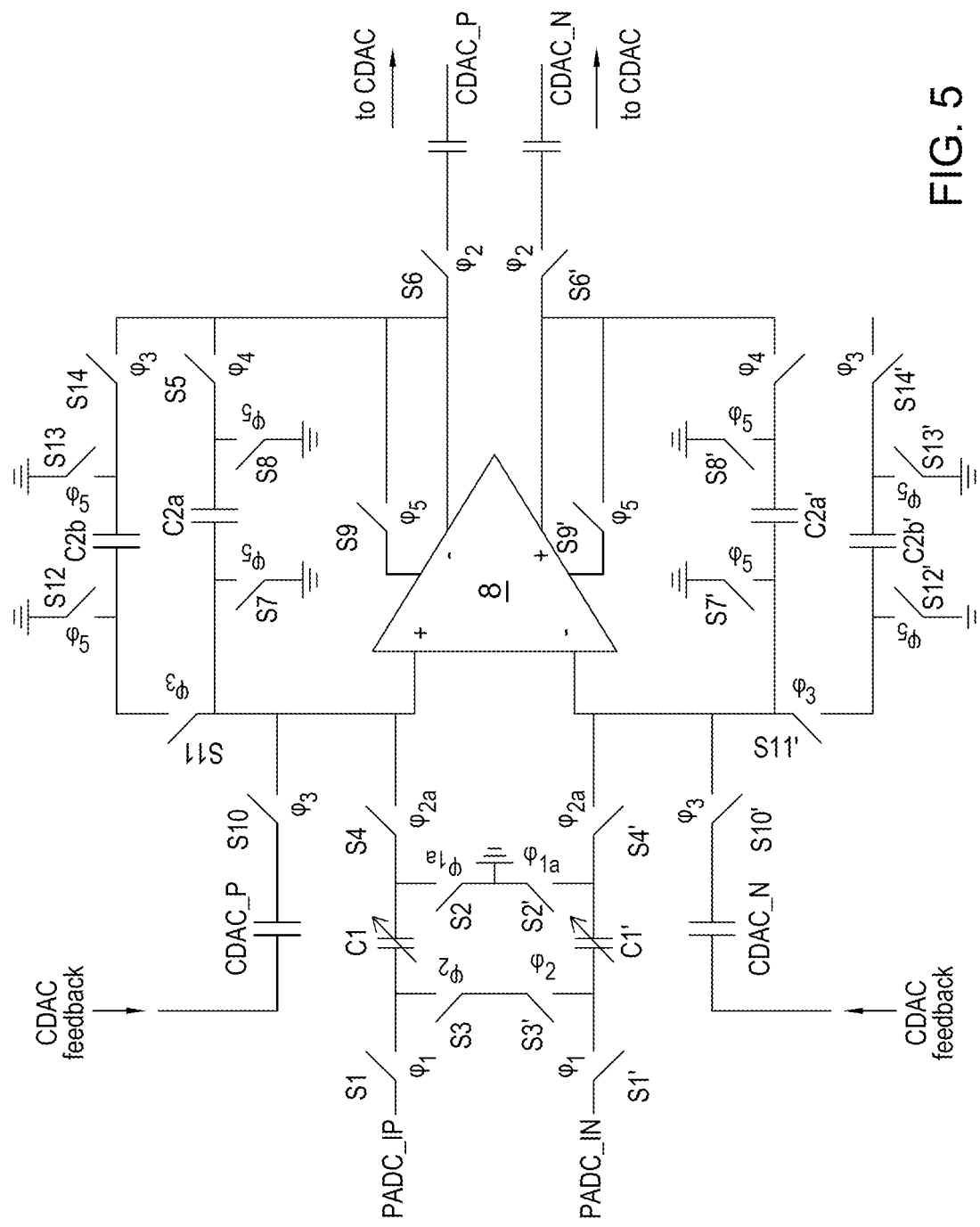
FIG. 5 is a more-detailed diagram of the input sampling buffer.

The input sampling buffer 2 has positive and negative paths that can be coupled to an operational transconductance amplifier (OTA) 8 and capacitors C1, C1', C2, C2', through a set of switches, the operation of which is described below. The switches are shown in simplified schematic form in FIG. 2, represented by six switches on each of the positive and negative sides, but a more detailed implementation using twenty-eight switches, labelled S1-S14, S1'-S14', is also shown in FIG. 5. The switches are controlled by the control block control logic, SAR_CTRL 6 or by a higher-level state machine.

Features of the input sampling buffer 2 and SAR-ADC 3 that particularly support the noise-shaping operation are shown in four dashed rectangles 9, 10, and are explained below.

To perform noise-shaping, the control logic, SAR_CTRL 6, controls the SAR-ADC 3 to convert a sample, sampled by the input buffer 2, in a conventional manner, by performing SAR bit-cycling with ten capacitors 7, "C512", "C256", . . . , "C4", "C2", "C1", of the CDAC 4. Here, "C" represents one unit capacitance, so "C512" indicates 512 unit capacitors.

The SAR_CTRL 6 then switches a respective pair of further capacitors 10, "C0.5", on each of the positive and negative sides, after the conversion, to get the residual voltage, by dividing the voltage after the least-significant-bit (LSB) decision in two. Each of the C0.5 capacitors 10 equals the C1 capacitors split in two; they do not suffer the same mismatch requirement as the rest of the CDAC 4.

Considering the positive side, after switching the C0.5 capacitor, the SAR_CTRL 6 enables two feedback switches 9 ($\varphi_{ErrorFB}$) to switch the input sampling buffer 2 to an error-feedback configuration. The input sampling buffer 2 then transfers the residue voltage from the top plates of the CDAC 4 to a gain-control feedback capacitor C2 in the input sampling buffer 2, and to corresponding capacitor C2' on the negative side. (Note, these are different from the capacitors "C2" in the CDAC 4.)

FIG. 2 shows a close-up of the input sampling buffer 2. At the same time as conversion and error-feedback are performed, the next sample can be collected on the input sampling capacitors C1 and C1'. (Note, these are different from the capacitors "C1" in the CDAC 4.)

Figure 3:
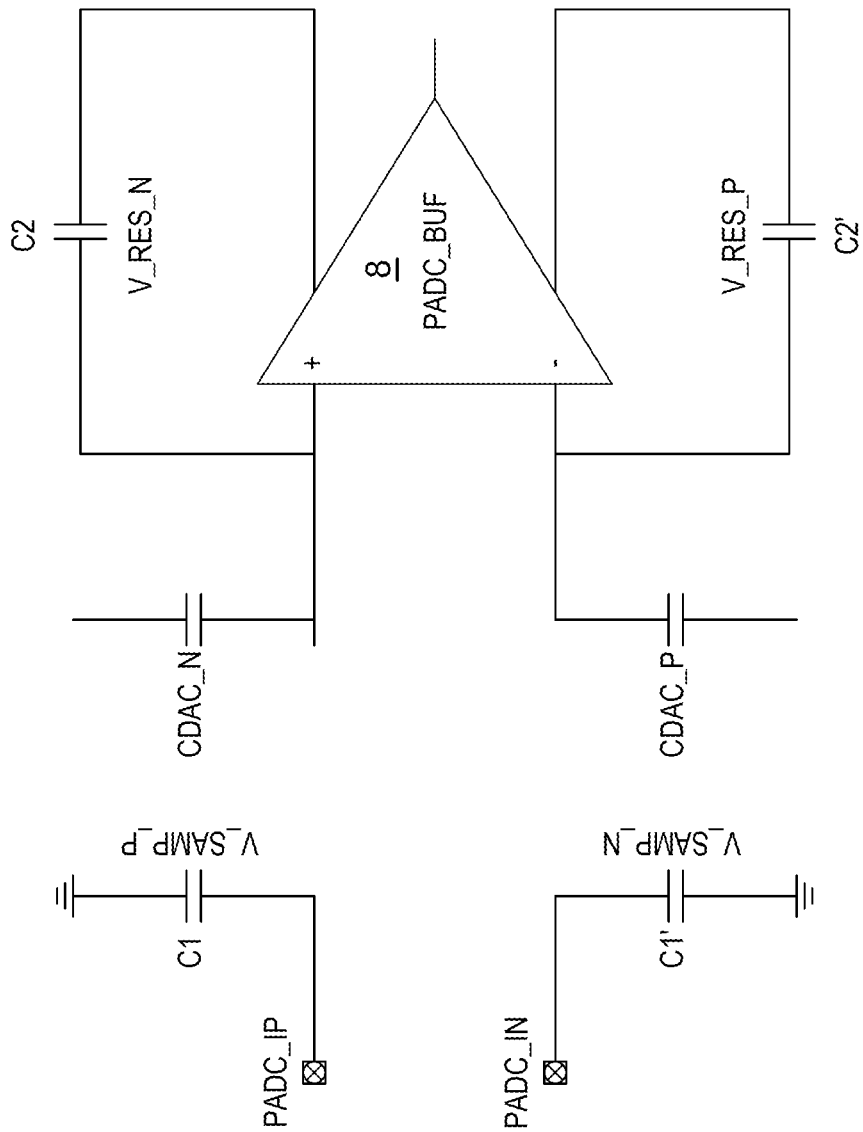
FIG. 3 is a simplified schematic diagram showing the input sampling buffer in an error-feedback configuration.

FIG. 3 provides a simplified schematic view of the input sampling buffer 2 still in the error-feedback configuration, showing the effect of the switches but omitting the switches themselves, to highlight how the next sample can be collected on C1 and C1', which are decoupled from the CDAC 4. When the transfer of residue voltage from the CDAC 4 to the feedback capacitor C2 in finished, and the sampling on C1 is also finished, the SAR_CTRL 6 operates the switches in the input sampling buffer 2 to set the buffer 2 to an amplification configuration, as shown in FIG. 4.

Figure 4:
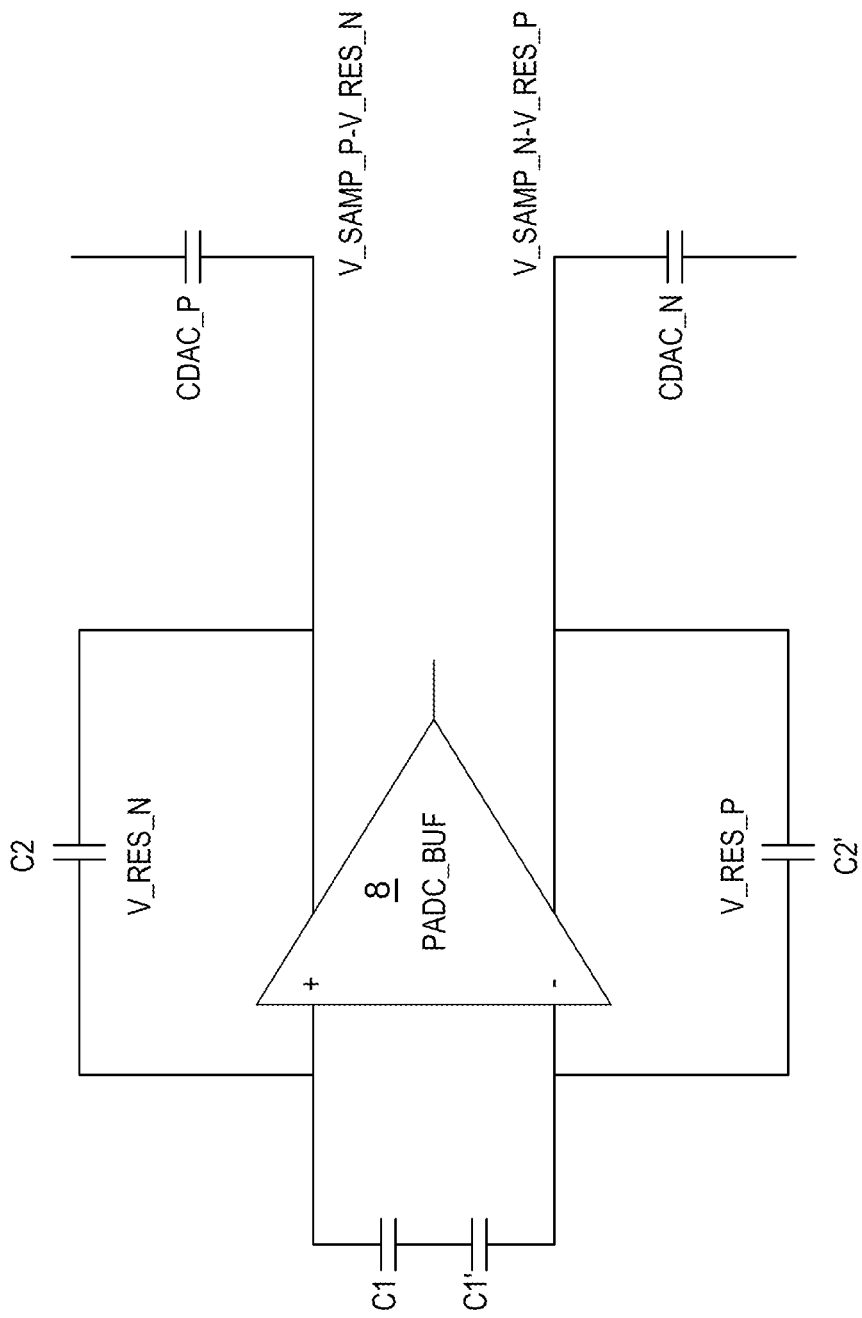
FIG. 4 is a simplified schematic diagram showing the input sampling buffer an amplification configuration.

FIG. 4 provides a simplified schematic view of the input sampling buffer 2 in the amplification configuration (again showing the effect of the switches, but not the switches themselves). In this configuration, the next sample is transferred from the capacitors C1, C1' onto the CDAC 4, through the OTA 8. However, the gain-control feedback capacitors C2, C2' are also coupled between the inputs and outputs of the OTA 8 so as to remove the voltage residue stored on the capacitors C2, C2', obtained from the previous sample, thereby transferring the difference between the sampled input voltage and the residue voltage to the CDAC 4. In this way error-feedback is applied to the new sample, as can be seen in the values of the voltages as shown in FIGS. 3 & 4.

To obtain one sample with noise-shaping, the ADC 1 can be controlled to take a number, X, of samples, by performing the operations above to obtain each of these X samples. The result from each of the X samples is passed to a digital decimation filter, in the output circuitry 11, to filter out of band noise. The output of the decimation filter is one sample out per X samples in. This provides noise-shaping through oversampling and decimation.

FIG. 5 is more-detailed schematic diagram of the input sampling buffer 2.

It shows how the capacitance C2, on each path, may be implemented as two separate capacitors: a gain-control feedback capacitor C2$a$, which is used both for determining the gain applied to samples and as an error-feedback capacitor for capturing the residue voltage from the SADC, and a dedicated error-feedback capacitor C2$b$, which is used for capturing the residue in parallel with C2$a$. The capacitors C2$a$ and C2$b$ are of equal size. The provision of C2$b$ in addition to C2$a$ allows the gain to be adjusted. When transferring the residue voltage, both C2$a$ and C2$b$ are connected. When capturing the feedback, the capacitor C2$b$ is either kept connected, together with C2$a$, or is disconnected, depending on a configurable gain setting. The total size of C2 is designed to match the total size of the CDAC 4, so as to get a gain of one in the transfer of the residue voltage. In some embodiments, one or more further dedicated error-feedback capacitors, C2$c$, C2$d$, C2$e$, etc., may be provided similarly, and can be switchably coupled in parallel with C2$a$ to provide further gain control.

When configured for amplification, the role of the input sampling buffer 2 is to take the I/O supply input range and divide it down to a reasonable range for the SAR-ADC core 3. In one example embodiment, it has a configurable range of gain settings, from ⅔ (e.g. 1.8Vppd with a 1.2V reference) to 4 (e.g. 300mVppd with a 1.2V reference).

Figure 6:
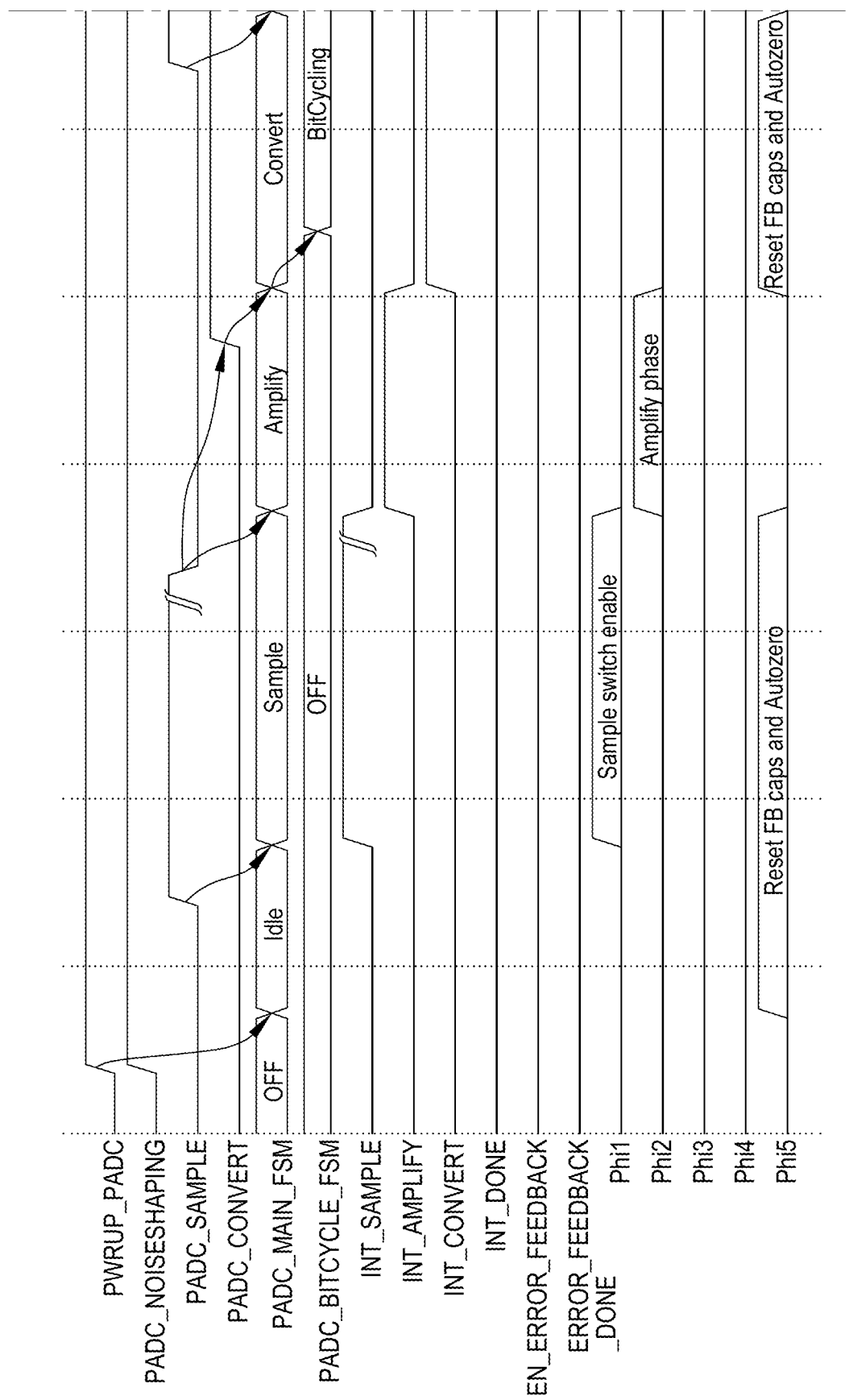
FIG. 6 is a timing diagram of the ADC and buffer operation when error-feedback noise-shaping is enabled.
Figure 6:
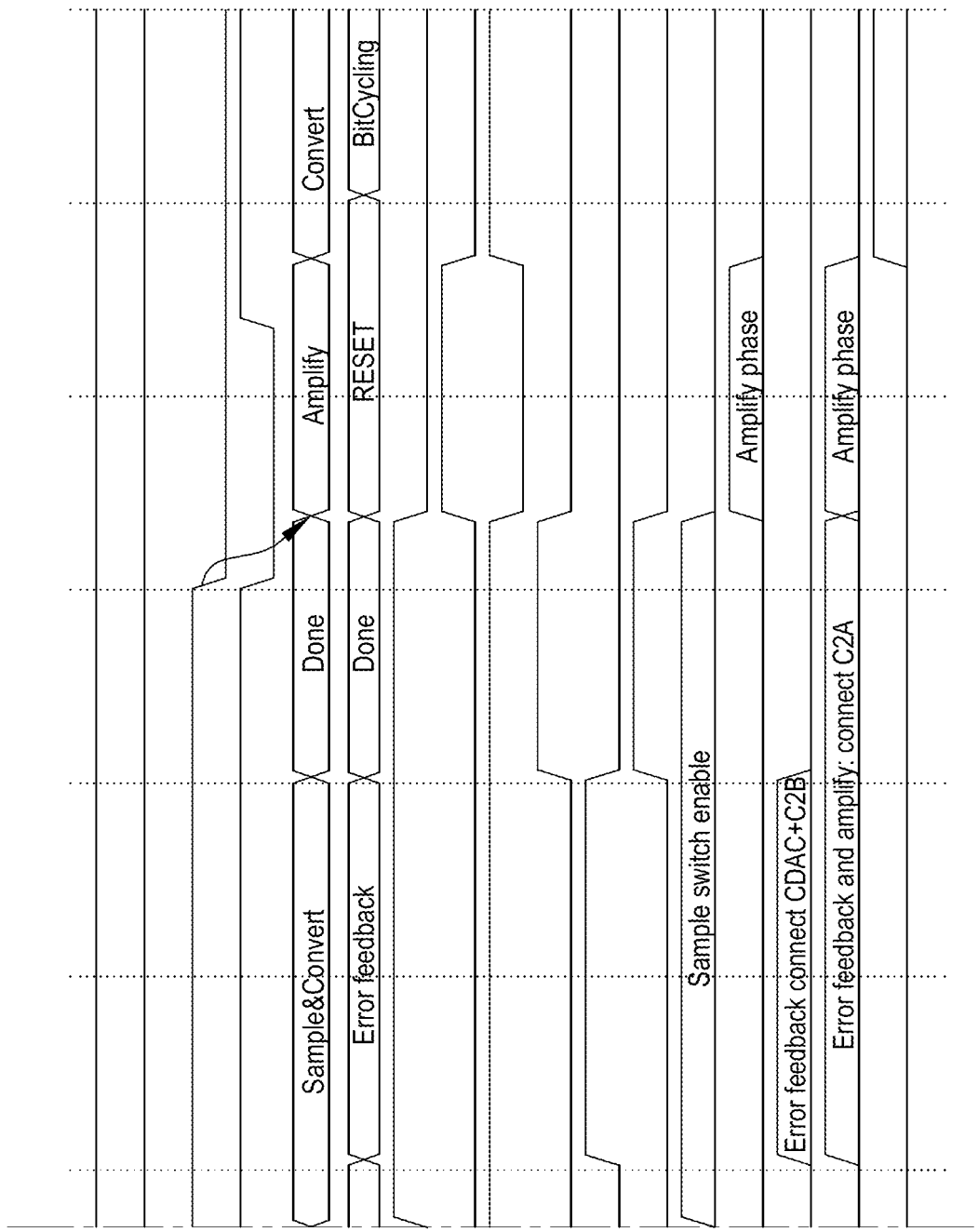
Figure 7:
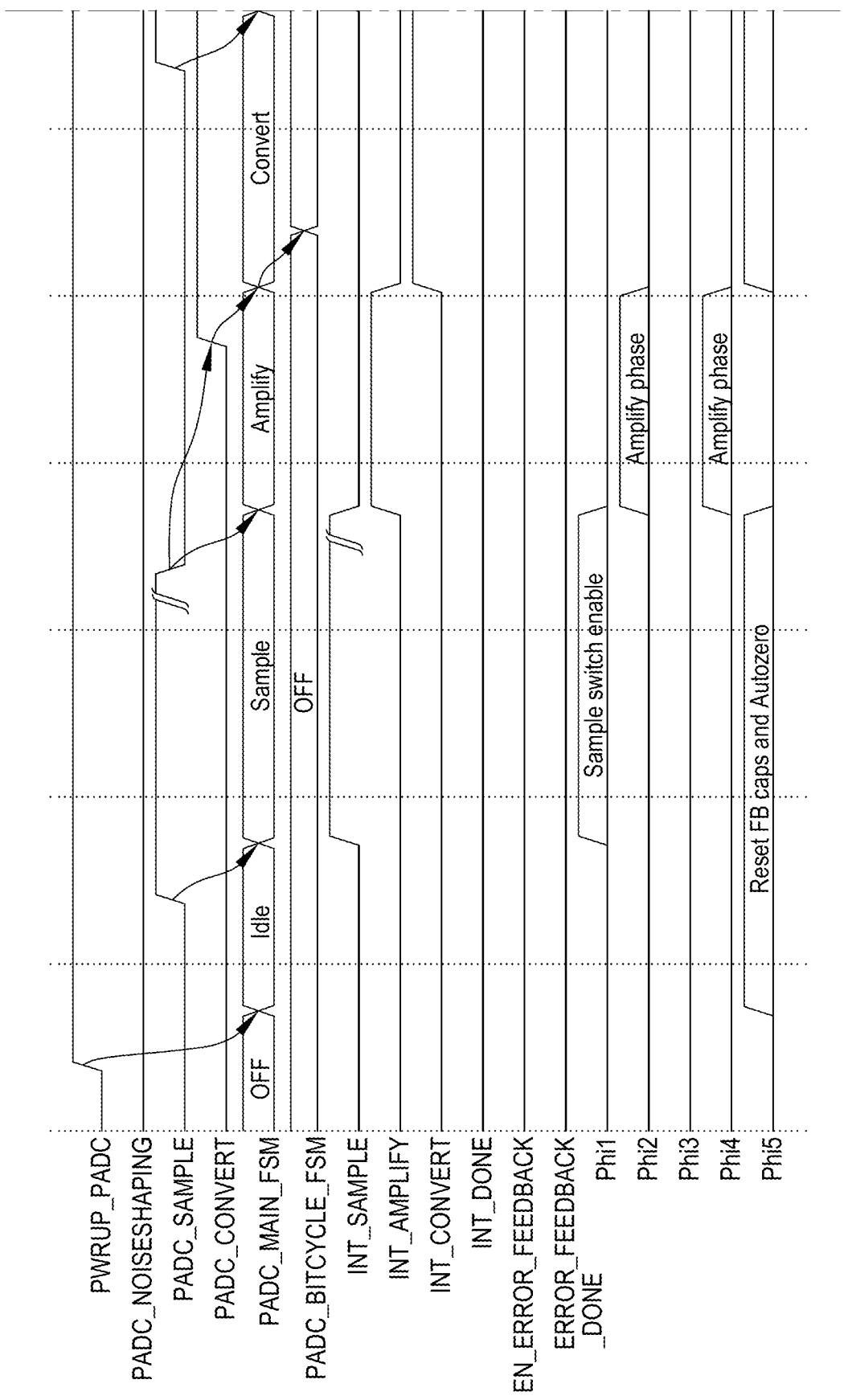
FIG. 7 is a timing diagram of the ADC and buffer operation when error-feedback noise-shaping is disabled.
Figure 7:
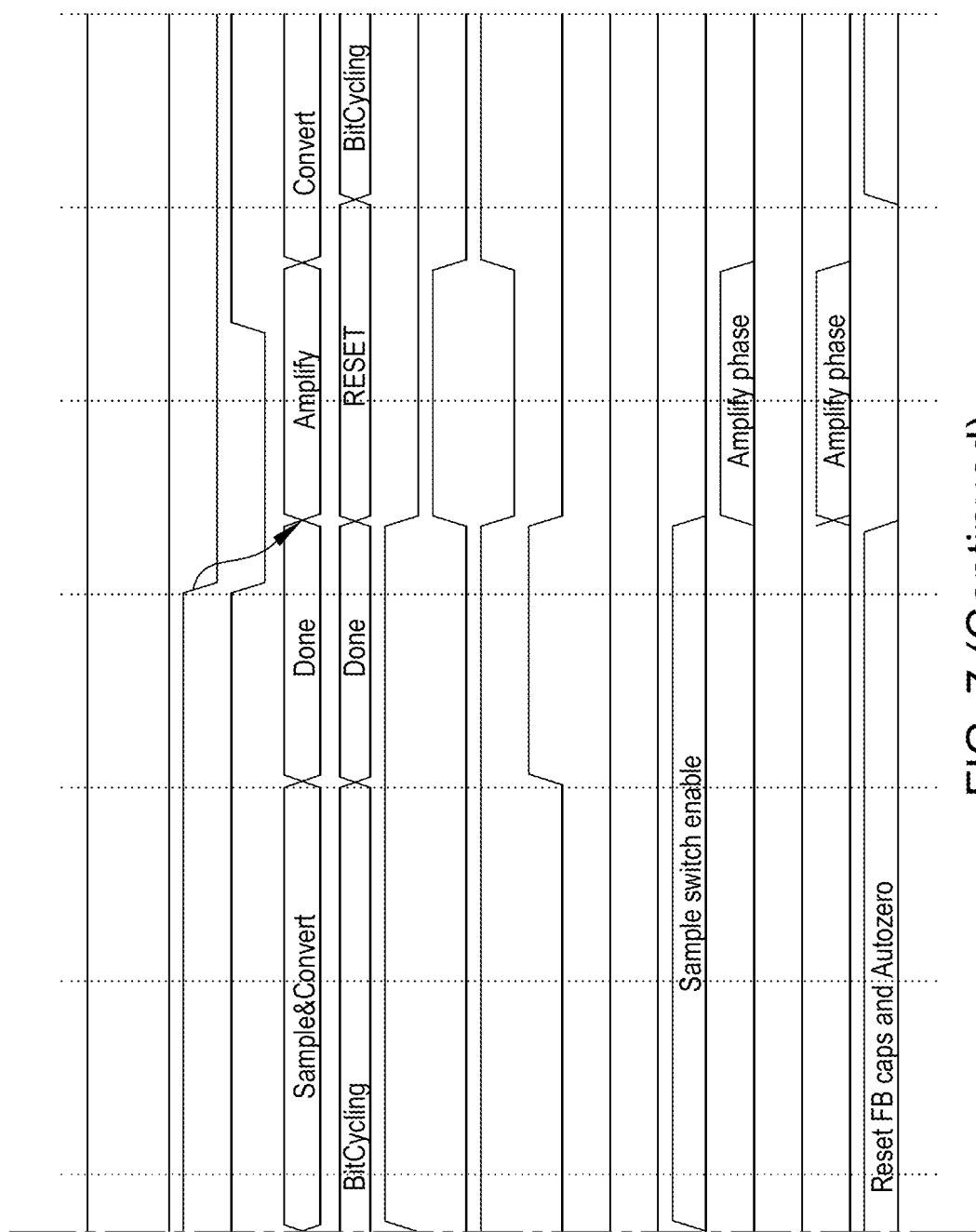

The following phases for the switches are labelled in FIG. 5, and their activations are shown in more detail in the timing diagrams in FIGS. 6 and 7:

$\varphi_1$: phase for sampling; $\varphi_{1a}$ indicates this is switched in advance to 1.

$\varphi_2$: input amplification phase; input sample is transferred to the CDAC 4. The amplification gain is C1/C2, where C2 depends on the gain configuration. C2 may equal C2$a$, or it may equal C2$a$+C2$b$ (if S11 & S14 are also activated, as explained below), or more generally C2 may equal C2$a$+C2$b$+C2$c$+C2$d$+ . . . when further switchable capacitors are connected.

$\varphi_3$: error-feedback phase; error residue is transferred from the CDAC 4 to C2$b$ (and also to C2$a$ through $\varphi_4$). This residue will remain on C2 for the next $\varphi_2$ to subtract it from input sample.

$\varphi_4$: this phase is a combination of $\varphi_2$||$\varphi_3$. If operating with noise-shaping disabled, then $\varphi_4$=$\varphi_2$, but with noise-shaping enabled, it will be enabled by $\varphi_3$ in order to capture the residue, and is kept high until is $\varphi_2$ done.

$\varphi_5$: RESET and AZ (autozero) phase; for autozeroes and resets the OTA feedback capacitors. Non-overlapping with $\varphi_2$, $\varphi_3$ and $\varphi_4$ and enabled when entering Idle or Convert states, described below. (The OTA 8 itself is autozeroed in the reset phase to cancel any offset voltage in the OTA 8.)

For some gain settings, the switches S11 and S14 may also be enabled in phase $\varphi_2$ (i.e. in the input amplification phase) so that the feedback capacitor C2$b$ is also connected, in parallel with the gain-control capacitor C2$a$, in the amplification configuration, in order to provide a desired gain for the ADC 1. The amplification gain during the amplification phase will then C1/(C2$a$+C2$b$). Where further capacitors C2$c$, C2$d$, etc. are provided, further switches can be operated to provide finer gain control.

The error-feedback noise-shaping can be turned on and off through the control logic 6 (e.g. by a microcontroller).

FIG. 6 is a timing diagram for the buffering and conversion operations when error-feedback noise-shaping is enabled.

FIG. 7 is a timing diagram for the buffering and conversion operations when error-feedback noise-shaping is disabled.

They show the following signals and states:

PWRUP_PADC: a control-input signal to power-up the ADC 1;

PADC_NOISEHAPING: a control-input signal to enable (or disable) error-feedback noise-shaping;

PADC_SAMPLE: a control-input signal to initiate capture of a sample;

PADC_CONVERT: control input to initiate conversion of the captured sample;

PADC_MAIN_FSM: represents the different states of a main finite state machine (FSM) within the control logic SAR_CTRL 6: OFF, Idle, Sample, Amplify, Convert, Sample&Convert, Done. The Sample state is entered only for the first sample after power up, with Sample&Convert being used for all subsequent samples.

Sample&Convert allows for "pipelined" sampling, in which the next sample is collected while the previous sample is converted, so whenever Sample goes high while in Convert, the Sample&Convert state is entered;

PADC_BITCYCLE_FSM: represents the different states of a bit-cycling finite state machine (FSM) within the control logic SAR_CTRL 6: OFF, BitCycling, Error feedback, Done, RESET.

The following four signals are output from the control logic SAR_CTRL 6 or from a higher-level state machine, and are distributed to the blocks that need them as appropriate:

INT_SAMPLE: an internal signal for sampling;

INT_AMPLIFY: an internal signal for amplifying the input;

INT_CONVERT: an internal signal for converting the sample;

INT_DONE: an internal signal indicating conversion is done;

As can be seen from the timing diagrams, the main FSM cycles through the same states whether or not noise-shaping is enabled. However, when noise-shaping is disabled, as in FIG. 7, the switch phase $\varphi_3$ is never activated. When noise-shaping is enabled, as in FIG. 6, the bit-cycling FSM enters an Error feedback state, after the BitCycling state, which causes the switch phase $\varphi_3$ to be active, as shown, causing the input sampling buffer 2 to enter the error-feedback configuration, described above. The switch phase $\varphi_4$ is also different when noise-shaping is enabled, to capture the residue on the capacitors C2$a$ and C2$b$ when the feedback path is connected. The timing diagrams show the signal flow when the gain of the input amplification is one, i.e. C2$a$=C1 in size in this scenario, with C2$b$ being disconnected before the amplification phase is entered.

Figure 8A:
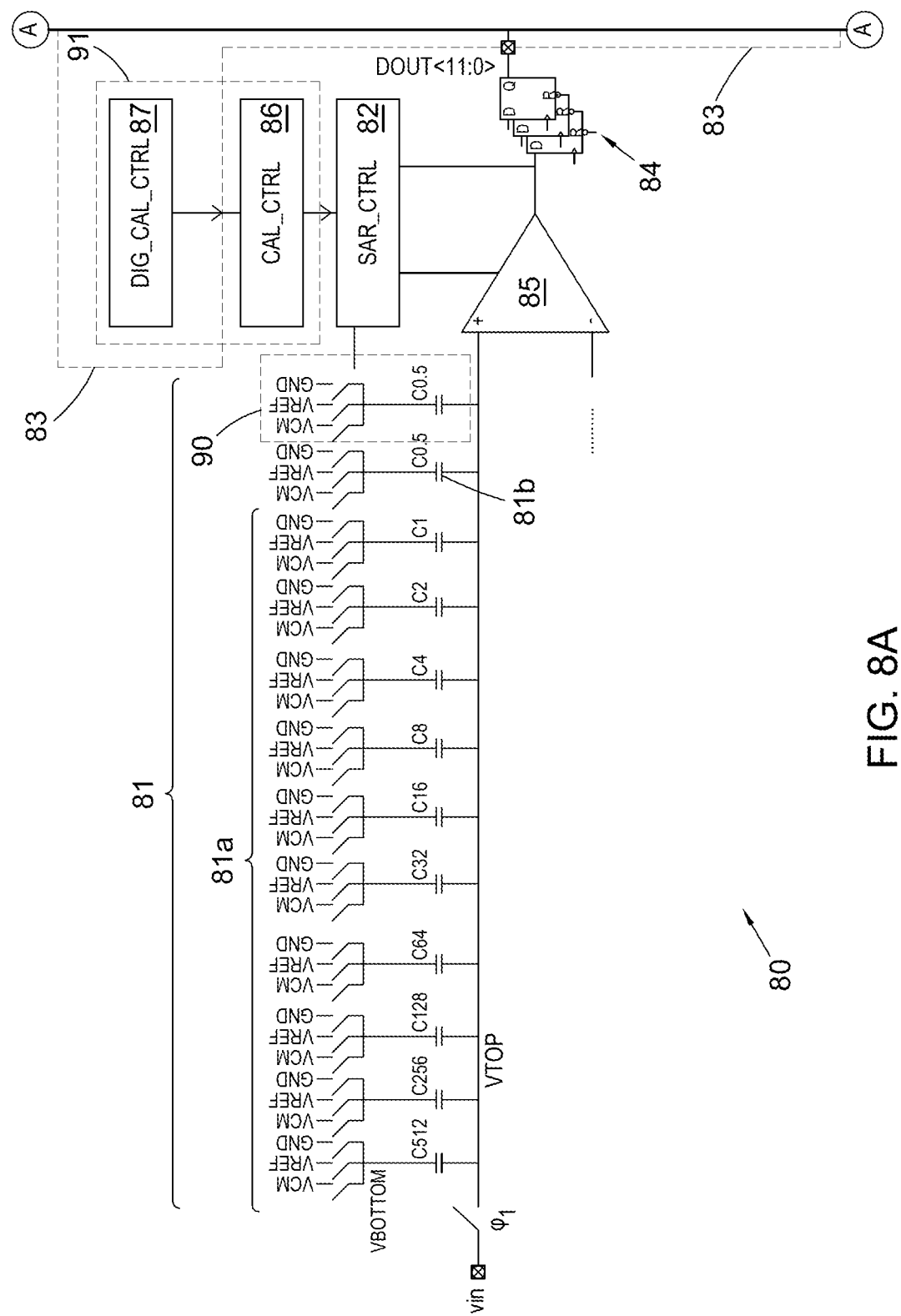
FIGS. 8A & 8B are split parts of a simplified schematic architectural diagram of another ADC, embodying the invention, that is self-calibrating.
Figure 8B:
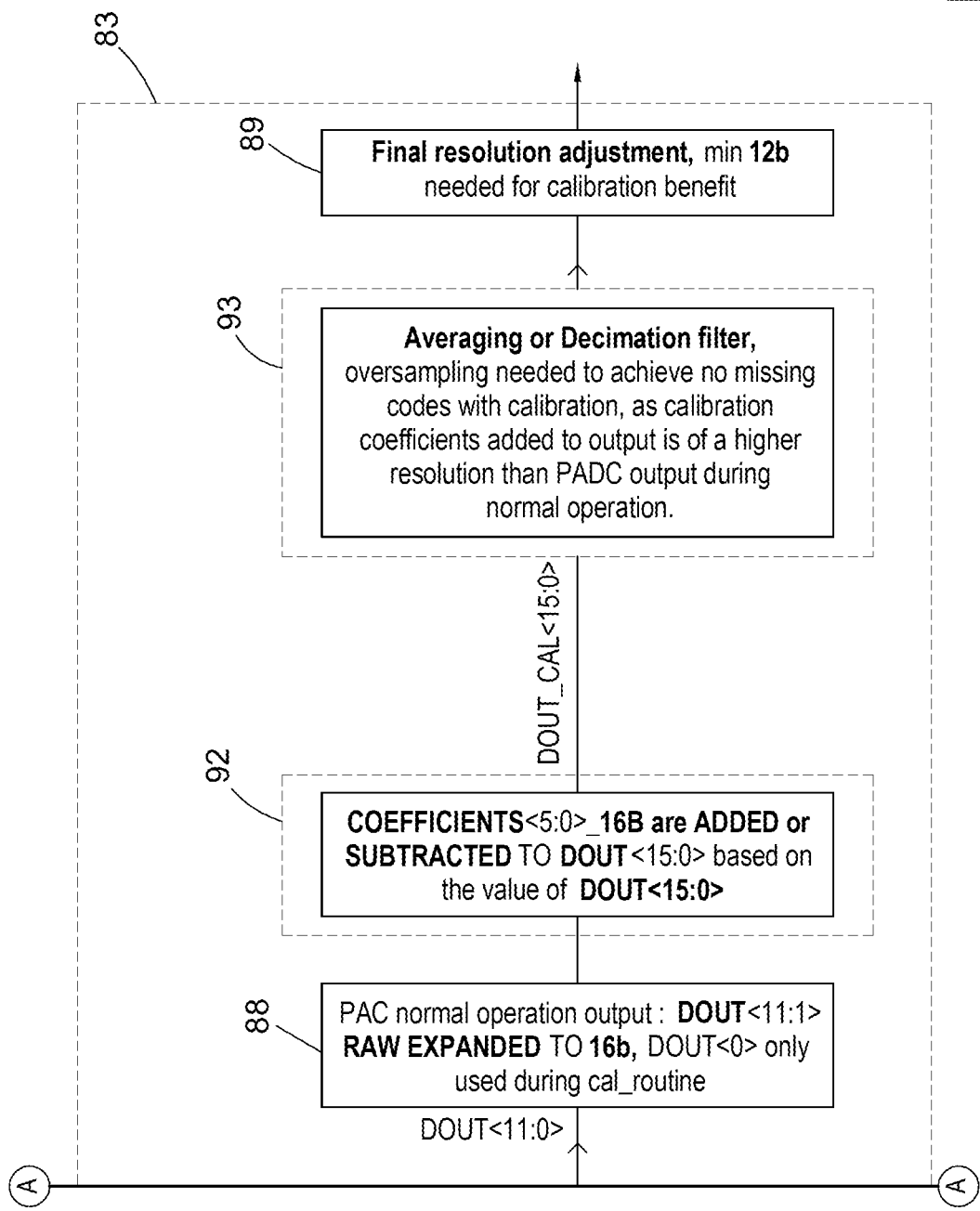

FIG. 8 (split across FIGS. 8$a$ & 8$b$) shows another SAR-ADC 80, embodying the invention, that again provides error-feedback noise-shaping, but with additional features for performing linearity calibration.

This ADC 80 has been designed with a custom CDAC 81 where the focus has been to reduce the amount of capacitance to a minimum to save power. The down side of this is higher mismatch and more noise. However, the error-feedback noise-shaping helps to mitigate the noise penalty. Noise-shaping may be used to reach very high accuracies on low frequencies. Linearity calibration is provided to achieve good linearity even in high accuracy modes. Linearity calibration enables the linearity to get to the same levels as noise where SNR (signal-to-noise ratio) SFDR (spurious free dynamic range).

FIG. 8 shows a high-level architectural diagram of parts of the analog and digital portions of the ADC SAR core 80. The ADC 80 has an input sampling buffer (not shown in FIG. 8, although represented schematically in FIGS. 12 & 13), similar to the input sampling buffer 2 of FIG. 1 above. This is connected to a differential CDAC 81 (only the positive side is shown in FIG. 8 for simplicity, but there is also a similar negative side), and control logic SAR_CTRL 82, similar to the SAR_CTRL 6 described above.

The ADC 80 also has higher-level digital logic output circuitry 83, comprising a calibration control logic block DIG_CAL_CTRL 87, for initiating and controlling the calibration procedure, by outputting appropriate control signals to the ADC 80, and for processing 12-bit digital output words received from a set of twelve flip flops 84 at the output of a comparator 85 of the CDAC 81. This circuitry 83 enables the capacitors to be measured in turn, and stores the results for further calculations. This digital control circuitry 83 may be implemented in hardware, as state machine implemented with dedicated logic gates, or it may be implemented at least partly by software executing on a processor of the device.

Notable features involved in the linearity calibration are indicated by dashed boxes 90, 91, 92 & 93, and are described below.

A lower-level calibration control logic block CAL_CTRL 86 handles internal operations of the ADC 80 by controlling switching during the calibration switching procedure, under the higher-level control of the calibration control logic block DIG_CAL_CTRL 87. These two blocks 86, 87 are features 91 involved in the linearity calibration. This particular exemplary ADC 80 is intended as an 11-bit ADC, so the CDAC 81 has ten main capacitors 81a, labelled "C1" up to "C512", on each side, where C is one unit capacitance, and where 512C means 512 unit capacitors. C1 to C512 therefore form a 10-bit CDAC. The reason this 11-bit ADC needs only a 10-bit CDAC 81 is that it implements a $V_{CM}$-based (common-mode-voltage based) switching scheme, which removes the need for the most-significant-bit (MSB) capacitor that, in a conventional 11-bit SAR-ADC, would be weighted 1024C.

The first capacitor 81b of a pair of 0.5C capacitors "C0.5", on the positive side, is provided to achieve noise-shaping as described above with reference to FIG. 1. This capacitor 81b is only switched when noise-shaping is activated to get the correct residue voltage to feed into the noise-shaping loop filter. The second 0.5C capacitor 90 is used in the linearity calibration scheme, so that in an ideal case, the MSB capacitor "C512" of the main bank 81a, divided by the capacitances of the other nine main capacitors 81a, plus the two half-LSB capacitors 8b & 90, equal 512C/(256C+128C+ . . . 0.5C+0.5C)=1.

The calibration procedure uses a switching scheme to provoke, and then convert, a residual voltage due to capacitor mismatch, and then implements an algorithm to use this converted residual to calculate calibration coefficients.

FIGS. 9-14 illustrate the calibration procedure by showing states of the analog side of the ADC 80 during five main phases the procedure. These phases 1 to 5 are repeated X number of times to get X conversions of the residual voltage, for each capacitor that is to be calibrated. In this embodiment, the top six most-significant capacitors, C512 to C16, are calibrated, while the five least-significant capacitors, C8, C4, C2, C1, C0.5, are used to convert any mismatch voltage, as explained below. Since the largest capacitors contribute most to the linearity of the ADC 80, it may be sufficient to leave the smallest capacitors uncalibrated.

Figure 9:
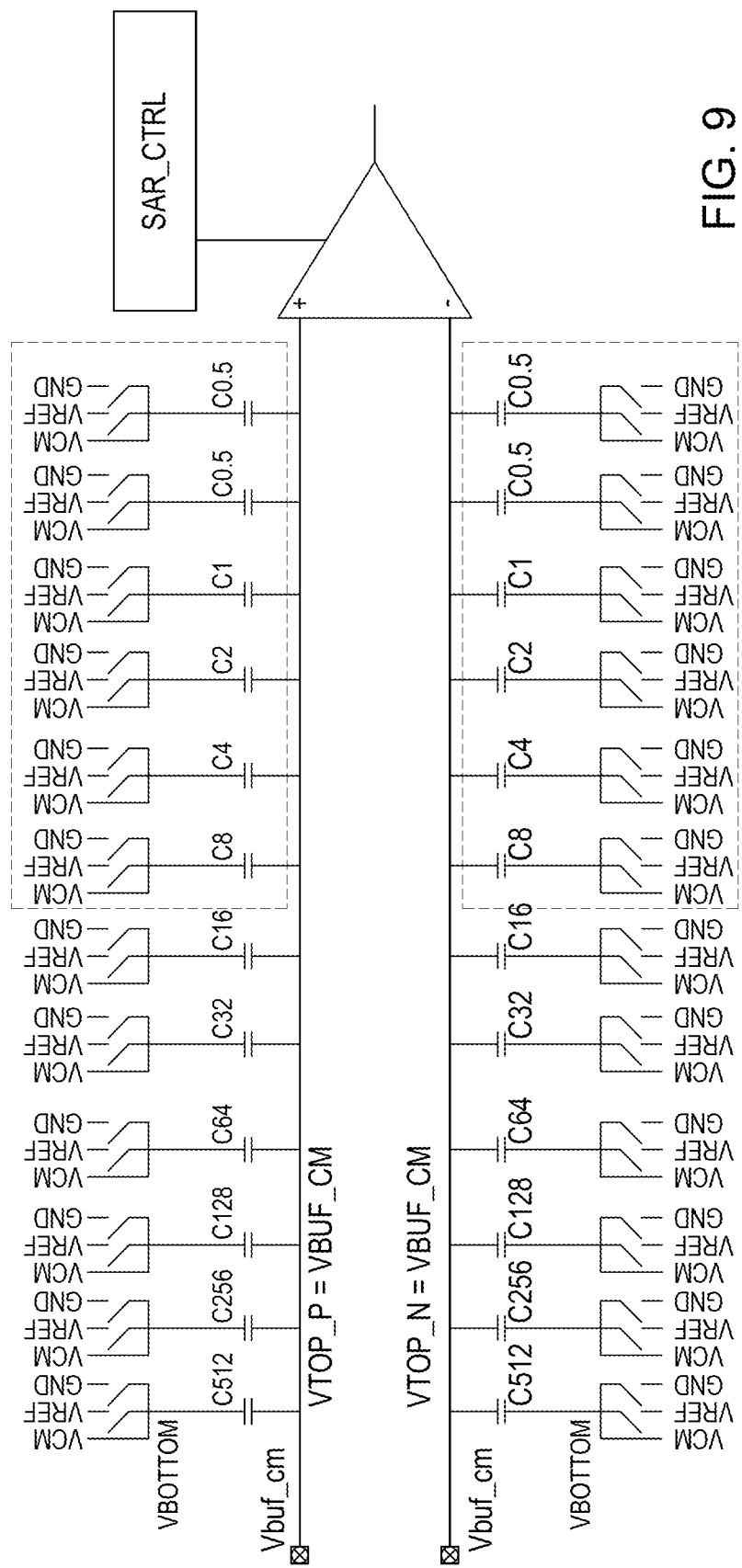
FIGS. 9, 10, 11, 12, 13 & 14 are schematic diagrams of parts of the self-calibrating ADC of FIG. 8, in different respective states, during successive steps of a calibration procedure.

FIG. 9 shows "phase 1" of the calibration procedure, in which the inputs of the ADC 80 are shorted and a regular sample is taken with the ADC 80. The voltage VBUF_CM is the output common mode from the OTA, PADC_BUF 120 (see FIGS. 12 & 13), of the input sampling buffer of the ADC 80. When taking a sample with the inputs of the ADC 80 shorted, the inputs of the input sampling buffer are shorted, so that both positive (P) and negative (N) sides of the ADC 80 will be charged to the buffer output common mode, and the differential voltage, VDIFF, is 0V. After phase 1, the sample taken in that phase is not converted normally, but instead the bottom plates in the CDAC 81 are switched according to FIG. 10. Although not shown in FIGS. 9 and 10, the ADC 80 has an input sampling switch that is closed while sampling the VBUF_CM (VDIFF=0), and that is opened to perform the switching operation shown in FIG. 10

The capacitors are calibrated individually in "phase 2" of the calibration procedure, starting the from the largest, most significant bit (MSB) capacitors and working downwards.

Figure 10:
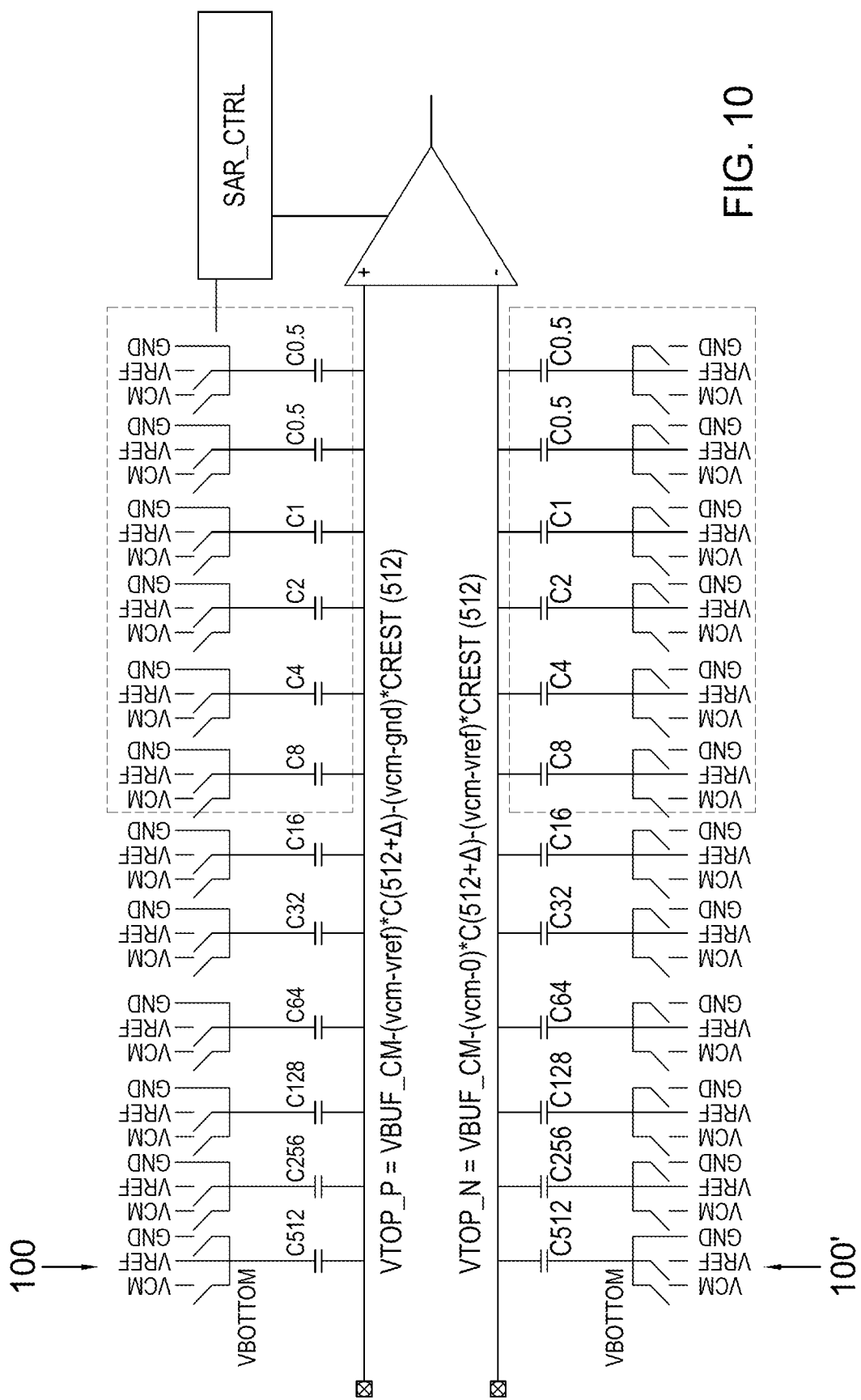

FIG. 10 shows an example in which the MSB cap 100 is being calibrated, which should ideally be weighted 512C, where C=1 unit capacitance. In this "phase 2", on the positive side, the capacitor 100 to be calibrated is switched to VREF and the rest of the bottom plates are switched to GND. On the negative side, the corresponding capacitor 100' is switched to GND with the rest of the bottom plates being set to VREF. In an ideal case, this would give a division that should result in 1 as explained above, but due to mismatch the result will not be exactly 1, and there will be a differential voltage between the P and N side that corresponds to the mismatch between C512 and the rest of the capacitors. On the P-side, this gives "V_RES_P", and on N-side it gives "V_RES_N".

Figure 11:
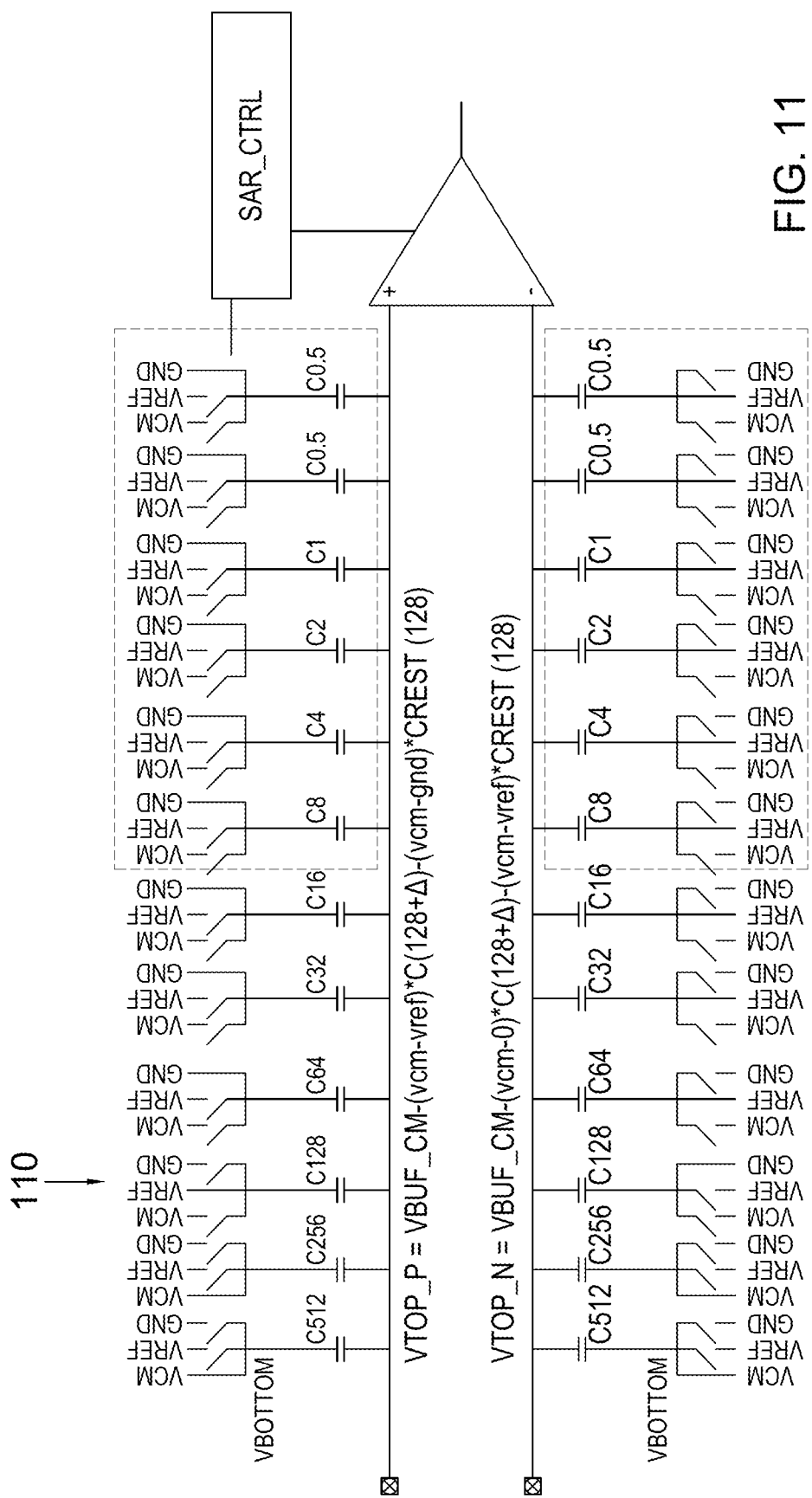

FIG. 11 illustrates measuring the MSB-2 capacitor C128, weighted 128C. The two capacitors (MSB, C512 and MSB-1, C256) that have already been measured and converted (i.e. for which phases 1 to 5 have been completed) are kept at $V_{CM}$, while the rest are switched in order to get the division C128/(C64+C32 . . . +C0.5+C0.5). This switching procedure provokes the mismatch residue voltage on the top plates of the CDAC 81. This residual voltage is sampled into the noise-shaping loop, using the input sampling buffer. The residual voltage is similar in magnitude from the residual voltage that is used in the noise-shaping mode.

Figure 12:
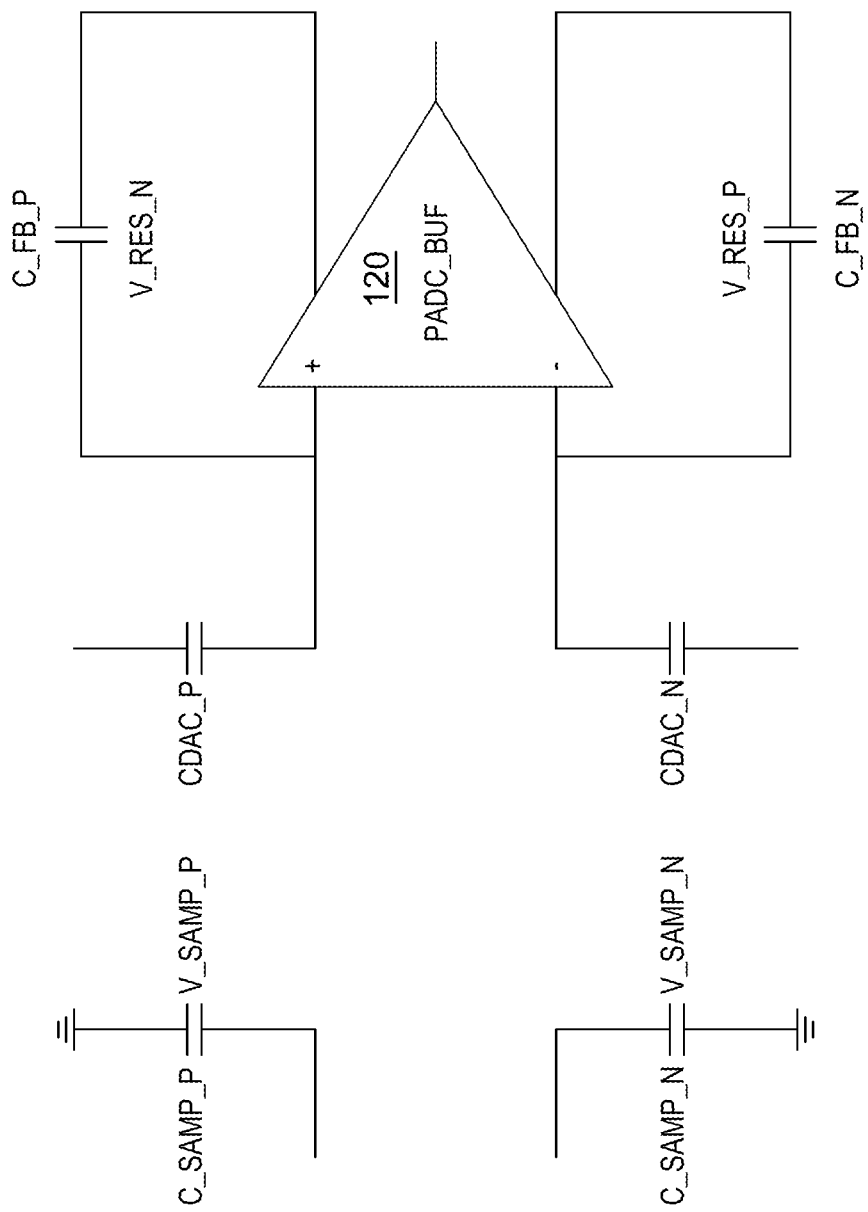

FIG. 12 shows "phase 3" of the calibration procedure, which uses the error feedback from the noise-shaping procedure to sample the residual voltage generated from phases 1 & 2 on the feedback capacitors in the buffer. The input-sampling capacitor pair, C_SAMP_P & C_SAMP_N (equivalent to C1 & C1' in the embodiment of FIG. 2) are here disconnected from the gain-control feedback capacitors, C_FB_P & C_FB_N (equivalent to C2 & C2' in the embodiment of FIG. 2). In particular, the residual voltage generated by the switching in phase 2 that is left on the top plates of the CDAC 81 is sampled by the error feedback noise-shaping loop, similar to the residual voltage during error feedback noise-shaping. In this way, the error feedback noise-shaping loop functions as a second input to the ADC 80, and the SAR logic can be reset after the residue is sampled, so that it will be ready for conversion by a "sub" ADC, formed of a capacitor subset consisting of the five least significant bit (LSB) capacitors, C8, C4, C2, C1, C0.5, which will not be calibrated. One important element in this step is the matching between the feedback capacitor pair, C_FB_P & C_FB_N, and the CDAC 81. If the ratio CDAC/CFB is not 1, there will be a "gain error" in the charge transfer of V_RES. It is expected that a tolerance of +/−20% gain error will be acceptable in the present design.

Sampling the mismatch residue onto the error-feedback capacitor C_FB (C2) allows the SAR-ADC 80 to be reset without the mismatch residue being deleted by the reset. Resetting allows the bottom plates and SAR logic to be reset back to the state it was in before the switching to provoke the mismatch voltage was performed, i.e. in its "IDLE" state, where all bottom plates are switched to VCM and the SAR logic is ready for bit cycling.

Figure 13:
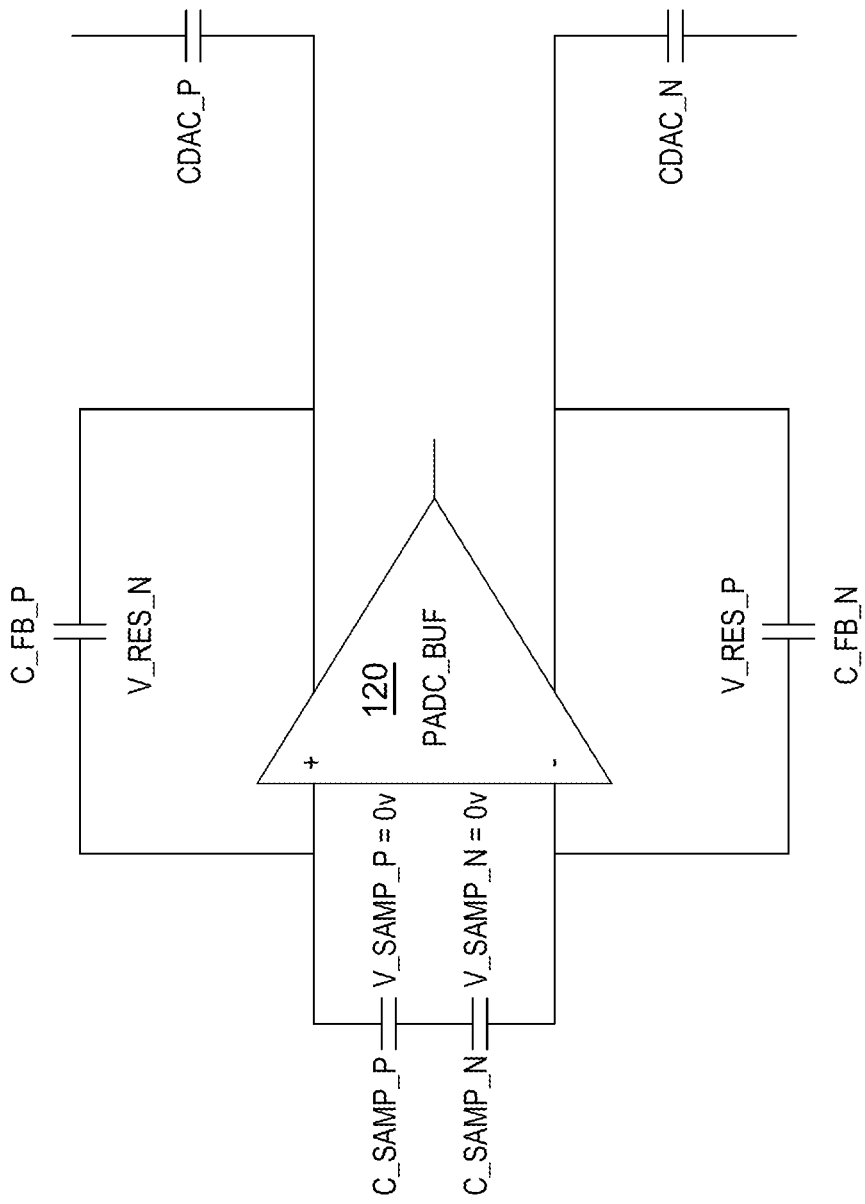

FIG. 13 shows "phase 4" of the calibration procedure, in which the sampled residual voltage from phase 2 is transferred back onto the CDAC 81 top plates of the SAR-ADC 80, while the inputs of the ADC 80 are shorted, as the SAR-ADC 80 is now reset and ready for conversion. The residue voltage was sampled on the feedback capacitors in the previous phase, while input capacitors of PADC_BUF were shorted, so that V_RES_P-V_RES_N is the only differential voltage being transferred back to the CDAC 81.

Figure 14:
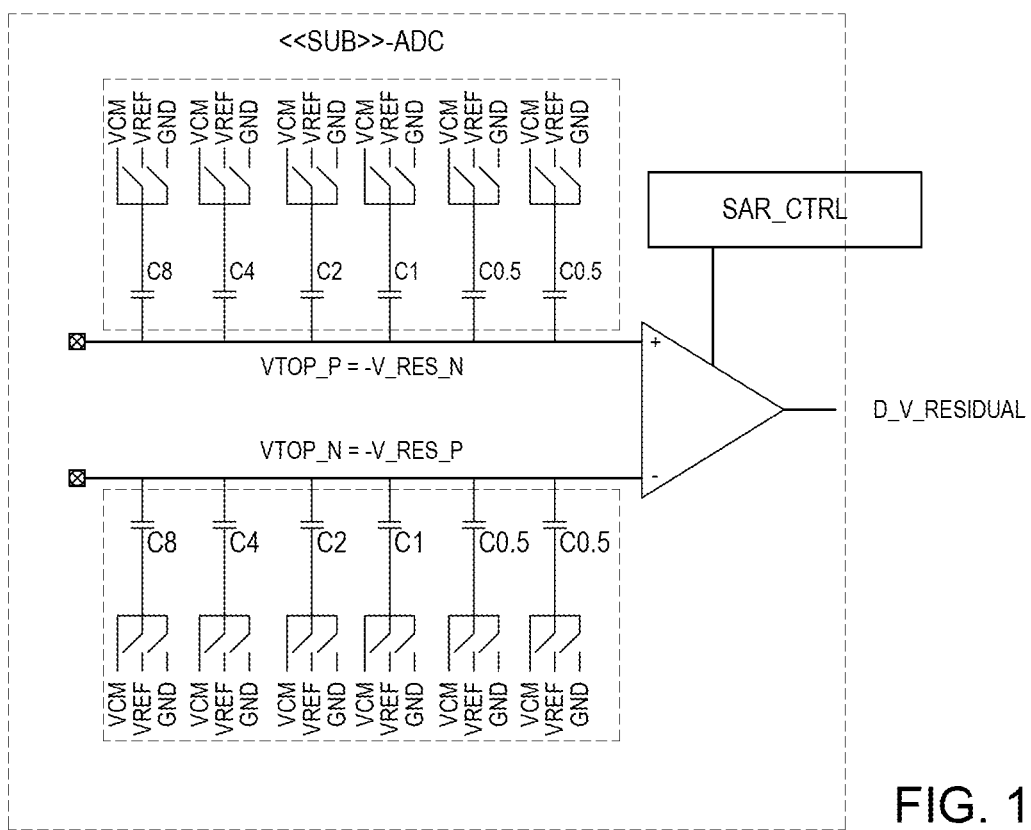

FIG. 14 shows "phase 5" of the calibration procedure, in which the residual voltage for each capacitor "n" is converted using a subset ("SUB" ADC) of the CDAC 81, made up by the five LSB capacitors, which will not themselves be calibrated (including the 0.5C weighted capacitor normally used for noise-shaping). The output of this conversion is the digitized residual voltage.

Phases 1 to 5 are repeated X number of times to get X conversions of the residual voltage, for each capacitor n, that is to be calibrated—e.g. the top six most significant capacitors C512 to C16. The X number of results for each individual capacitor shall be averaged in order to suppress noise for higher accuracy (similar as setting oversampling in normal operation). The average of X results from X conversions on the residual voltage for capacitor n is referred to as $V_{xn}$.

Even though the conversion of the residual "mismatch" voltage essentially uses a "6 bit" ADC, the output of this conversion will be referred to here as 11-bit, which is the same resolution as the ADC core in normal operation. The result of this conversion is adjusted, in a final digital output stage 89, so that it is centred around mid-code of the ADC 80. The ADC output is encoded as offset binary, and mid-code is when PADC_IP-PADC_IN=0, which gives PADC_BOUT_0V8=11'b100 0000 0000. This output may be extended with 1 bit, to be 12 bit, in some situations, and mid code will then be PADC_BOUT_0V8=12'b1000 0000 0000. So, the output result of the conversions when running the calibration routine, is in the six LSBs of PADC_BOUT_0V8—i.e. the underlined bit of: 12'b0000 0000 0000. In some embodiments, the last bit may be ignored in normal operation. Thus, the LSB of the 12-bit output is only considered in the calibration routine, but these six bits may be mapped to a 11-bit resolution, and the ADC output in normal operation will be 11-bit. The 6-bit output, when encoded as offset binary, can vary from −32 to +31, where 6'b00 0000=−32 and 6'b11 1111 is +31. These values may be mapped to the equivalent values in 11-bit resolution, meaning −32 to +31 where 11'b011 1110 0000 is −32 and 11'b100 0001 1111 is +31.

Calibration coefficients can then be calculated for the ADC 80 as described below. These calculations may be implemented in software, executing on a microcontroller or other processor attached to the ADC 80, or could potentially be implemented in hardware.

Because of non-linearities, the capacitors will not have the perfect weights as shown in the figure, but they will have an error. The actual capacitor value that includes this error can be written as $$C_n = 2^{n-1}(1+e_n), n=1A, 1B, 2 \ldots N$$

where n is the capacitor number in the CDAC 81, and N is the number of the MSB capacitor. The CDAC 81 in this exemplary ADC 80 is 10 bits, and the two 0.5C weighted capacitors can be numbered 1 and 1 (or 1A and 1B, to distinguish them). This deviation from ideal weights will manifest itself as an error voltage for each capacitor switch operation performed, and this error voltage can be expressed as $$V_{en} = \frac{V_{ref}}{2^N} 2^{n-1} e_n, n = 1B, 2, 3 \ldots N$$

The total linearity error can be expressed as $$V_{error} = \sum_{i=1B}^{N} V_{ei} D_i$$

After the switching operations are done for a capacitor n in phase 1 and phase 2, there will be a residual voltage left on the top plates of the CDAC 81 that can be used to calculate the individual error voltage for the respective capacitor n. In a differential ADC 80, the calibration coefficient, or error voltage, of the MSB capacitor can be expressed as $$V_{eN} = \frac{V_{xN}}{4}$$

So, once the residual voltage $V_{xN}$ is converted, it need only be divided by 4 to get the error voltage, or calibration coefficient, related to the MSB capacitor. The rest of the calibration coefficients can be found by evaluating the equation $$V_{en} = \frac{1}{4}\left(V_{xn} - \sum_{i=n+1}^{N} V_{ei}\right), n = 1B, 2, 3 \ldots N-1$$

In the ADC 80, the six MSB capacitors are calibrated, which results in six calibration coefficients, from N down to N−5. When calibrating the ADC output during normal operation, the calibration coefficients will either be added or subtracted from the raw output data, depending if its corresponding bit is 1 or 0 respectively by a logic stage 92 in the digital output circuitry 83.

When running the conversions on residual voltages from the calibration switching procedure, the six bits with the results from the conversion are mapped to offset-binary-encoded 11-bit resolution, meaning the result will be in the range −32 to +31 where 11'b011 1110 0000 is −32 and 11'b100 0001 1111 is +31. This is done by just adding the 6-bit result 6'bXXXXXX to 11'b011 1110 0000. This makes sure that when the mid code for the 6-bit results=6'b10 0000 is added to 11'b011 1110 0000, it gives 6'b10 0000+11'b011 1110 0000=11'b100 0000 0000=0, which is mid code.

To calculate the calibration coefficients, this 11-bit result is expanded to 16 bits, in a first digital stage 88, by multiplying by $2^5$. Then X samples of each residual voltage $V_{xn}$ are averaged, by performing phases 1 to 5 of the calibration switching X times, storing results from each run as a 16-bit numbers, and averaging all the results. This averaging, or decimation, filter is applied by a logic stage 93 in the digital output circuitry 83. Then these 16-bit values for $V_{xn}$ can be used in the equations for $V_{eN}$ and $V_{en}$ to calculate the calibration coefficients.

This will result in six calibration coefficients [$\text{Coeff}_{512\_16b}$ $\text{Coeff}_{256\_16b}$ $\text{Coeff}_{128\_16b}$ $\text{Coeff}_{64\_16b}$ $\text{Coeff}_{32\_16b}$ $\text{Coeff}_{16\_16b}$], which will be added or subtracted from the PADC_BOUT_0V8 value depending on the corresponding bit decision. This means that, for the result PADC_BOUT_0V8=11'b100 000X XXXX, the final calibrated result will be PADC_BOUT_0V8_CALIBRATED=PADC_BOUT_0V8+ $\text{Coeff}_{512\_16b}$-($\text{Coeff}_{256\_16b}$+$\text{Coeff}_{128\_16b}$+$\text{Coeff}_{64\_16b}$ $\text{Coeff}_{32\_16b}$ $\text{Coeff}_{16\_16b}$)

The MSB bit that corresponds to $\text{Coeff}_{512\_16b}$ is 1, so this coefficient is added to the final result, while the rest of the bits are 0, so these are subtracted from the result. The X's means that there are no calibration coefficients related to these bits.

The result PADC_BOUT_0V8=11'b011 111X XXXX, would give PADC_BOUT_0V8_CALIBRATED=PADC_BOUT_0V8- $\text{Coeff}_{512\_16b}$+($\text{Coeff}_{256\_16b}$+$\text{Coeff}_{128\_16b}$+$\text{Coeff}_{64\_16b}$ $\text{Coeff}_{32\_16b}$+$\text{Coeff}_{16\_16b}$)

Since the calibration coefficients are 16 bits, PADC_BOUT_0V8 is expanded to 16-bit before the calibration operation takes place. In order to benefit from the calibration, the final resolution of the output should be at least 12 bits.

This calibration is efficient, and with a standard deviation for the unit capacitors of 1.5%, is expected to give a mean improvement in SFDR of 15 dB for the ADC 80.

Typically, the mismatch of the capacitors is unlikely to change much over time, so the calibration may, at least in some embodiments, be run only occasionally, e.g. on boot up after a reset. Once the calibration coefficients are calculated, the ADC 80 may be set to run without calibration in normal operation, e.g. until the next device reset.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. Analog to digital conversion circuitry, comprising:
   an input sampling buffer, comprising an input sampling capacitor, for sampling an analog signal; and
   a successive-approximation-register analog to digital converter (SAR-ADC) arranged to convert the analog signal, sampled by input sampling buffer, to a digital signal,
   wherein the input sampling buffer further comprises an amplifier and a gain-control capacitor; and
   wherein the input sampling buffer has an amplification configuration and an error-feedback configuration, wherein, when the input sampling buffer is in the amplification configuration, the input sampling capacitor is coupled to the amplifier and gain-control capacitor, with the gain-control capacitor connected in feedback with the amplifier, for applying gain to the analog signal sampled by the input sampling capacitor, and, when the input sampling buffer is in the error-feedback configuration, the gain-control capacitor is decoupled from the input sampling capacitor and is arranged to receive a residue voltage from the SAR-ADC, such that the level of the analog signal determined in the amplification configuration varies, at least in part, in dependence on the residue voltage received onto the gain-control capacitor in the error-feedback configuration.

2. The analog to digital conversion circuitry of claim 1, wherein the analog to digital conversion circuitry is arranged to provide error-feedback noise-shaping.

3. The analog to digital conversion circuitry of claim 1, wherein the analog to digital conversion circuitry is configured to oversample the input signal and comprises a decimation filter for down-sampling the digital signal generated by the SAR-ADC.

4. The analog to digital conversion circuitry of claim 1, wherein:
   the SAR-ADC is a differential converter;
   the amplifier is a differential amplifier; and
   the input sampling buffer comprises a pair of input sampling capacitors and a pair of gain-control capacitors.

5. The analog to digital conversion circuitry of claim 1, wherein the input sampling buffer comprises a set of one or more switches for switching the input sampling buffer between the amplification configuration and the error-feedback configuration, and wherein analog to digital conversion circuitry comprises control logic for controlling the switches.

6. The analog to digital conversion circuitry of claim 1, wherein the input sampling buffer is configured to receive the analog signal onto the input sampling capacitor when in the error-feedback configuration.

7. The analog to digital conversion circuitry of claim 1, wherein the analog to digital conversion circuitry is configured to control the input sampling buffer to cycle between the error-feedback configuration and the amplification configuration once for each sample of a succession of samples provided to the SAR-ADC from the input sampling buffer.

8. The analog to digital conversion circuitry of claim 1, wherein the input sampling buffer is arranged to subtract a residue voltage determined for one sample from the next sample in a succession of samples.

9. The analog to digital conversion circuitry of claim 1, wherein the input sampling buffer comprises one or more dedicated-error-feedback capacitors, each arranged to be switchably connected in feedback with the amplifier, independently from the gain-control capacitor.

10. The analog to digital conversion circuitry of claim 1, wherein the SAR-ADC comprises a capacitor digital-to-analog converter (CDAC), and wherein the analog to digital conversion circuitry comprises calibration circuitry for calibrating each capacitor, or each differential capacitor pair, of a plurality of capacitors or capacitor pairs of the CDAC, wherein the calibration circuitry is arranged, when calibrating a capacitor or capacitor pair, to switch capacitors of the CDAC so as to generate a residual mismatch voltage that is proportional to a mismatch between the capacitor or capacitor pair being calibrated and one or more further capacitors or capacitor pairs of the CDAC.

11. The analog to digital conversion circuitry of claim 1, wherein the analog to digital conversion circuitry supports a calibration configuration, for calibrating the SAR-ADC, in which the gain-control capacitor is decoupled from the input sampling capacitor and is arranged to receive a mismatch voltage from the SAR-ADC.

12. The analog to digital conversion circuitry of claim 11, comprising calibration circuitry configured to use a subset of capacitors of a capacitor digital-to-analog converter (CDAC) of the SAR-ADC to convert the mismatch voltage.

13. The analog to digital conversion circuitry of claim 1, wherein the analog to digital conversion circuitry is configured to calculate calibration coefficients from digital measurements, output by the SAR-ADC, of mismatches of a set of capacitors of the SAR-ADC, and to adjust the digital signal output by the SAR-ADC in dependence on the calculated calibration coefficients.

14. An integrated-circuit device comprising the analog to digital conversion circuitry of claim 1.

15. An analog to digital conversion method, comprising:
sampling an analog signal with an input sampling capacitor;
using an amplifier and a gain-control capacitor, connected in feedback with the amplifier, to apply gain to the analog signal sampled by the input sampling capacitor;
converting the analog signal to a digital signal using a successive-approximation-register analog to digital converter (SAR-ADC); and
decoupling the gain-control capacitor from the input sampling capacitor and feeding a residue voltage from the analog to digital converter back to the gain-control capacitor, such that the level of the analog signal, after gain is applied, is determined, at least in part, by a residue voltage previously received onto the gain-control capacitor.

16. The analog to digital conversion method of claim 15, further comprising performing error-feedback noise-shaping, wherein the error-feedback noise-shaping comprises oversampling the input signal and down-sampling the digital signal generated by the SAR-ADC.

17. The analog to digital conversion method of claim 15, comprising cycling between i) using the gain-control capacitor to apply gain to the analog signal, and ii) feeding a residue voltage from the analog to digital converter back to the gain-control capacitor, on every sample of a succession of samples sampled by the input sampling capacitor.

18. The analog to digital conversion method of claim 15, comprising subtracting a residue voltage determined for one sample from the next sample in a succession of samples sampled by the input sampling capacitor.

19. The analog to digital conversion method of claim 15, further comprising calibrating each capacitor, or each differential capacitor pair, of a capacitor digital-to-analog converter (CDAC) of the SAR-ADC by switching capacitors of the CDAC so as to generate a residual mismatch voltage that is proportional to a mismatch between the capacitor or capacitor pair being calibrated and one or more further capacitors or capacitor pairs of the CDAC.

20. The analog to digital conversion method of claim 15, further comprising calibrating the SAR-ADC, wherein the calibrating comprises:
decoupling the gain-control capacitor from the input sampling capacitor;
receiving a mismatch voltage from the SAR-ADC on the gain-control capacitor; and
using a subset of capacitors of a capacitor digital-to-analog converter (CDAC) of the SAR-ADC to convert the mismatch voltage.

* * * * *